United States Patent
Yang et al.

(10) Patent No.: US 11,094,386 B1
(45) Date of Patent: Aug. 17, 2021

(54) DEVICE, SYSTEM, AND METHOD TO VERIFY DATA PROGRAMMING OF A MULTI-LEVEL CELL MEMORY BASED ON ONE OF TEMPERATURE, PRESSURE, WEAR CONDITION OR RELATIVE POSITION OF THE MEMORY CELL

(71) Applicant: Intel Corporation, Santa Clara, CA (US)

(72) Inventors: Xiang Yang, Santa Clara, CA (US); Tarek Ahmed Ameen Beshari, Santa Clara, CA (US); Narayanan Ramanan, San Jose, CA (US); Arun Thathachary, Santa Clara, CA (US); Shantanu Rajwade, San Mateo, CA (US); Matin Amani, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/790,074

(22) Filed: Feb. 13, 2020

(51) Int. Cl.
*G11C 16/34* (2006.01)
*G11C 11/56* (2006.01)
*G11C 16/30* (2006.01)
*G11C 16/26* (2006.01)
*G11C 16/10* (2006.01)
*G11C 11/419* (2006.01)

(52) U.S. Cl.
CPC ........ *G11C 16/3459* (2013.01); *G11C 11/419* (2013.01); *G11C 11/5628* (2013.01); *G11C 11/5642* (2013.01); *G11C 16/10* (2013.01); *G11C 16/26* (2013.01); *G11C 16/30* (2013.01); *G11C 16/349* (2013.01)

(58) Field of Classification Search
CPC ..... G11C 16/3459; G11C 16/10; G11C 16/30; G11C 16/349; G11C 16/26; G11C 11/5642; G11C 11/5628
See application file for complete search history.

(56) References Cited

U.S. PATENT DOCUMENTS

| 2005/0213387 A1* | 9/2005 | Kubo | G11C 5/145 365/185.21 |
| 2013/0188431 A1* | 7/2013 | Scheuerlein | G11C 8/08 365/189.09 |

(Continued)

OTHER PUBLICATIONS

Extended European Search Report for European Patent Application No. 20207998.4 dated Apr. 14, 2021.

*Primary Examiner* — Sultana Begum
(74) *Attorney, Agent, or Firm* — Green, Howard & Mughal LLP.

(57) ABSTRACT

Techniques and mechanisms for verifying the programming of a multi-bit cell of a memory array. In an embodiment, program verification is performed based on a signal, other than a word line voltage, which includes an indication of a reference voltage that is to be a basis for evaluating a currently programmed threshold voltage of a memory cell. A determination that the particular indication is to be communicated with the signal is made based on a detected state of the memory device which includes the memory cell. In another embodiment, the detected state includes one of a thermal condition at the memory array, a pressure condition at the memory array, a wear condition of the memory array, or a relative position of the cell with respect to one or more other cells of the memory array.

20 Claims, 10 Drawing Sheets

(56) References Cited

U.S. PATENT DOCUMENTS

| | | |
|---|---|---|
| 2013/0223155 A1 | 8/2013 | Oowada et al. |
| 2013/0227200 A1 | 8/2013 | Cometti et al. |
| 2016/0203856 A1* | 7/2016 | Sachdev ............... G11C 11/419 365/154 |
| 2017/0032838 A1* | 2/2017 | Park ................... G11C 13/0002 |
| 2018/0277229 A1 | 9/2018 | Takizawa et al. |

* cited by examiner

DEVICE, SYSTEM, AND METHOD TO VERIFY DATA PROGRAMMING OF A MULTI-LEVEL CELL MEMORY BASED ON ONE OF TEMPERATURE, PRESSURE, WEAR CONDITION OR RELATIVE POSITION OF THE MEMORY CELL

BACKGROUND

1. Technical Field

The present disclosure relates generally to memory devices and, more particularly, but not exclusively, to controller circuitry which is to verify a programming of a multi-level cell memory.

2. Background Art

Nonvolatile memory devices are capable of persisting data for extended periods of time without needing to be powered to maintain such data storage. Information is written to a flash memory device by changing the electrical characteristics of transistor-based memory cells to change how such memory cells react to applied voltages. The electrical characteristics of different memory cells in a flash memory device are representative of binary bits that can be read by sensing output voltages of the memory cells in response to applied input voltages.

When programming nonvolatile memory devices, verification techniques are often used to ensure that information has been correctly programmed. For example, verification techniques can be used to read recently programmed information and determine whether the correct information is actually being persisted as intended. In this manner, when a program verify confirms that an instance of information is not correctly persisted, one or more further attempts can be made to program that information. Using such verification techniques increases the likelihood that the correct information is persisted in a nonvolatile memory device.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
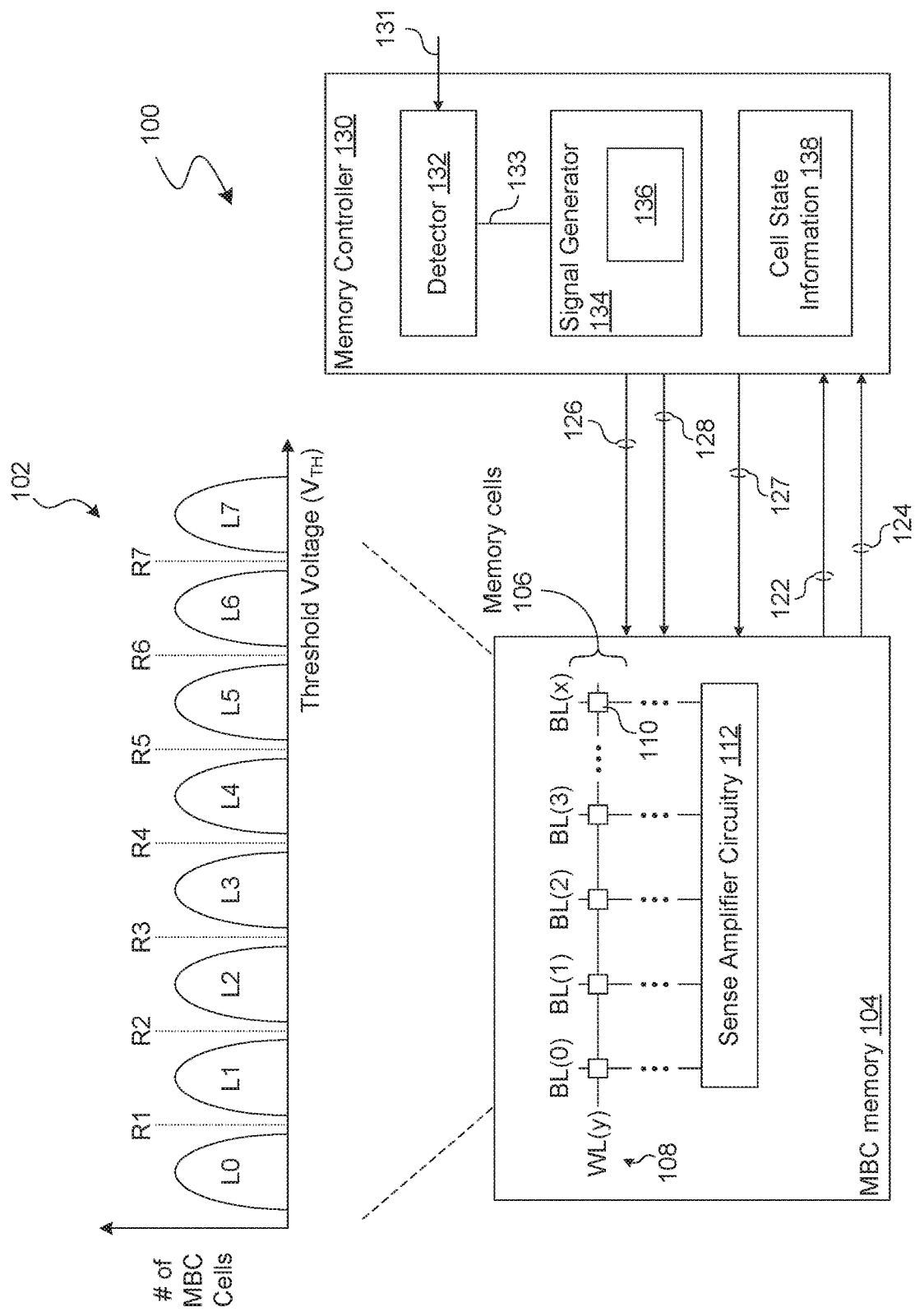
FIG. 1 illustrates a functional block diagram showing features of a system including a memory controller to perform program verification with a memory according to an embodiment.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e., scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

It is pointed out that those elements of the figures having the same reference numbers (or names) as the elements of any other figure can operate or function in any manner similar to that described, but are not limited to such.

Embodiments described herein variously provide techniques and mechanisms for verifying the programming of a multi-bit cell of a memory array. Some embodiments facilitate program verification based on a signal, other than a word line voltage, which includes an indication of a reference voltage that is to be a basis for evaluating a currently programmed threshold voltage of a memory cell. A determination that the particular indication is to be communicated with the signal is made based, for example, on a detected state of the memory device. In one such embodiment, the detected state includes one of a thermal condition at the memory array, a pressure condition at the memory array, a wear condition of the memory array, or a relative position of the cell with respect to one or more other cells of the memory array.

As used herein, "program verification" (also referred to as "write verification") and related terms variously refer to operations to detect, for a transistor of a given memory cell, whether a currently programmed threshold voltage ($V_{TH}$) of the transistor corresponds to data which is intended to be written to said memory cell. The term "reference voltage level" refers herein to a voltage level, which is to be a basis for detecting a currently programmed threshold voltage ($V_{TH}$) of a memory cell. For example, program verification according to some embodiments includes a sense amplifier communicating information (e.g., a binary value) which indicates whether a currently programmed threshold voltage ($V_{TH}$) is greater than a particular reference voltage level The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including a memory and circuitry to verify a write to said memory.

FIG. 1 illustrates a system 100, according to an embodiment, which comprises a memory controller 130 to perform program verify operations on a multiple-bit per cell (MBC) memory. The program verify operations are to confirm that intended data is stored in one or more memory cells, such as cells of the illustrative MBC memory 104 shown. For example, the memory 104 includes a plurality of memory cells that are generally referred to herein using reference numeral 106. In the illustrated example, the memory cells 106 are programmed or can be programmed to variously store information during a programming phase, where memory cells 106 are available to be subsequently accessed one or more times during read phases to read the stored information. During a given programming phase and/or read phase of some examples, one or more different ones of the memory cells 106 are selectively activated to program information only in desired ones of the memory cells 106 and/or to read information from only desired ones of the memory cells 106. Selected ones of the memory cells 106 for programming, verifying and/or reading are referred to as target memory cells, and non-selected ones of the memory cells 106 are referred to as non-target memory cells.

The MBC memory 104 illustrates an embodiment wherein a NAND flash memory (for example) stores two or more binary bit values per memory cell 106. For example, some embodiments are implemented in connection with NAND flash memories that store two-bit per cell (2 bpc) NAND flash memories (often referred to as multi-level cell (MLC) flash memories), 3 bpc NAND flash memories (often referred to as triple-level cell (TLC) flash memories), 4 bpc NAND flash memories (often referred to as quad-level cell (QLC) flash memories), 5 bpc NAND flash memories (often referred to as penta-level cell (PLC) flash memories), or any other suitable types of memories that store any number of bits per cell. Various embodiments are used in connection with any of various types of memory in which different levels of electrical current that flow through memory cells of those memories are representative of corresponding information stored in the memory cells.

In the illustrated example, the memory controller 130 and the memory 104 may be integrated into a single flash memory integrated circuit (IC) package. For example, the memory controller 130 and the memory 104 may be on the same die and placed into the same IC package, or may be on separate die and bonded to one another in the same IC package. Alternatively, the memory controller 130 may be in a separate IC package from the memory 104.

In the illustrated example, some of memory cells 106 are located in a same word line WL(y) 108 (e.g., a row). Also in the illustrated example, each of the memory cells 106 is located on a corresponding bit line (BL) shown as BL(0) through BL(x). Each of the memory cells 106 of the illustrated example is addressed by activating—e.g., including applying a word line read-verify voltage ($V_{WLRV}$) to—the word line WL(y) 108 and precharging a corresponding one of the bit lines BL(0)-BL(x). The memory 104 of the illustrated example is provided with example sense amplifier circuitry 112 to sense programmed states of the memory cells 106. For example, when the word line WL(y) 108 and one or more bit lines BL(0)-BL(x) are selected to activate one or more targeted ones of the memory cells 106, electrical currents variously flow through the target ones of the memory cells 106 based on the respective programmed threshold voltages ($V_T$) of those memory cells 106. The sense amplifier circuitry 112 latches values based on those electrical currents to identify programmed states of the target ones of the memory cells 106. In some embodiments, memory 104 further comprises data caches (not shown) to store values, latched by the sense amplifier circuitry 112, which correspond to information stored in the memory cells 106.

A NAND flash cell (for example) uses the threshold voltage of a floating-gate transistor to represent the data stored in the cell. In a single-level cell (SLC) NAND flash memory, each memory cell has two voltage levels corresponding to two states (0, 1) to represent one bit. In a MLC, TLC and QLC NAND flash memory, each memory cell stores more than one bit. Each cell in a MLC NAND Flash memory uses four voltage levels corresponding to four states (00, 01, 10, 11) to represent 2 bits of binary data. Each cell in a TLC NAND Flash memory uses eight voltage levels corresponding to eight states (000 to 111) to represent 3 bits of binary data. Each cell in a QLC NAND Flash memory uses sixteen voltage levels corresponding to sixteen states (0000 to 1111) to represent 4 bits of binary data.

An MLC NAND Flash memory cell is programmed to one of four threshold voltages based on the logical value that the flash memory cell represents. The logical multi-bit value stored in the Flash cell is read by comparing a threshold voltage of the Flash memory cell with reference voltages. During a read operation to a MLC NAND Flash memory cell, a read reference voltage is applied to the transistor corresponding to the MLC NAND Flash memory cell. If the applied read reference voltage is higher than the threshold voltage, the transistor is turned on. The threshold voltage of the NAND Flash memory cell is compared with the applied read reference voltage to determine the logical two-bit value (00, 01, 10 or 11) represented by the threshold voltage.

In one example embodiment, MBC memory 104 is a TLC memory that stores three bits-per-cell (3bpc) based on eight threshold voltage levels ($V_{TH}$) shown as L0-L7 of a threshold voltage distribution 102. In the illustrated example, different ones of the memory cells 106 are programmable to different ones of the plurality of threshold voltages ($V_{TH}$) to store corresponding ones of the multi-bit binary values. For example, the threshold voltage levels ($V_{TH}$) L0-L7 are representative of different corresponding multi-bit binary values (e.g., L0: 000; L1: 001; L2: 010; L3: 011; L4: 100; L5: 101; L6: 110; L7: 111) that can be stored in the memory cells 106 by programming or changing the electrical characteristics of the memory cells 106. For example, each memory cell 106 includes a transistor having electrical characteristics configurable to output one of the threshold voltage levels ($V_{TH}$) (e.g., a threshold voltage level of the transistor), thereby indicating a stored one of the multi-bit binary values.

The threshold voltage distribution 102 of the illustrated example is indicative of the number of memory cells 106 programmed to different ones of the threshold voltage levels ($V_{TH}$). In the illustrated example, the threshold voltage levels ($V_{TH}$) L0-L7 are separated by reference voltage levels R1-R7. The reference voltage levels R1-R7 form boundaries within which the threshold voltage levels ($V_{TH}$) L0-L7 must be located to represent a corresponding multi-bit binary value. For example, if threshold voltage level L1 represents binary value 001, a memory cell 106 intended to store the binary value 001 must output a threshold voltage that is between reference voltage levels R1 and R2. In another embodiment, MBC memory 104 is a QLC memory or otherwise supports at least four bits per cell.

For different program verify operations, different memory cells 106 are designated target memory cells depending on what data is being verified. For example, one program verify operation may check those of memory cells 106 that are intended to store a binary value of one (e.g., 001) and, thus, any memory cell 106 in a word line intended to store a binary one is designated a target memory cell. A subsequent program verify operation may check those of memory cells 106 that are intended to represent a particular 3-bit logical value (e.g., 011) and, thus, any memory cell 106 in a word line intended to store a binary three is designated a target memory cell. The MBC memory 104 of the illustrated example is a three bit-per-cell (3bpc) memory. However, examples disclosed herein may be implemented in connection with MBC flash memories or any other suitable types of memories that store fewer bits per cell (e.g., 2bpc) or more bits per cell (e.g., 4bpc, 5bpc, etc.).

The memory controller 130 of the illustrated example is configured to perform program verify processes by selecting target cells (e.g., including the illustrative cell 110 shown) and using selective precharging of bit lines to verify data written to the selected target cells. For example, program verify processes disclosed herein are performed in connection with memory cell programming passes of MBC memory cells so that a write operation to a page or word line of MBC memory cells is completed after the program verify process confirms that all intended data is successfully written to the MBC memory cells. For example, after a memory cell programming pass to change electrical characteristics of the cell 110 to store corresponding data, the memory controller 130 performs a program verify operation on the cell 110 to confirm that the intended data is correctly stored in cell 110.

In the illustrated example, during a program verify process, the memory controller 130 causes the word line WL(0) 108 to be ramped to a verify word line read voltage ($V_{WLRV}$). In addition, the memory controller 130 causes selective precharging of one or more of bit lines BL(0), BL(1), BL(2), BL(3), . . . , BL(x)—e.g., wherein bit line BL(x) is precharged to facilitate verification of programming at cell 110. In some embodiments, during a first time corresponding to a pre-program verify (PPV) strobe, the memory controller 130 obtains a first output of cell 110. In an embodiment, the example first output obtained from cell 110 includes or otherwise indicates a binary zero or one corresponding to a sensed threshold voltage ($V_{STH}$) output by cell 110—e.g., where the first output obtained from cell 110 indicates whether the sensed threshold voltage ($V_{STH}$) is above a predefined minimum PPV voltage level. The sensed threshold voltage ($V_{STH}$) is indicative of an electrical characteristics programmed into a transistor of cell 110 during a memory cell programming pass. The programmed electrical characteristic allows more or less electrical current to flow through the target cell 110 to generate a threshold voltage ($V_{TH}$) representative of data stored therein.

In some embodiments, some or all memory cells of MBC memory 104 each include—or alternately, are coupled to—a respective temporary cache capacitor (not shown) that is in circuit with a corresponding word line (WL). A given one of said temporary cache capacitors is operable to be biased with a charge during the PPV strobe so that the first output obtained from cell 110 is representative of a threshold voltage output by cell 110 based on a bias held in the corresponding temporary cache capacitor.

During a second time corresponding to a program verify (PV) strobe, the memory controller 130 obtains one or more second outputs each from a respective one or more cells—e.g., including a respective second output obtained from cell 110. In an embodiment, the example second output obtained from cell 110 includes or otherwise indicates a binary zero or one corresponding to the sensed threshold voltage ($V_{STH}$) output by cell 110—e.g., where the second output obtained from cell 110 indicates whether the sensed threshold voltage ($V_{STH}$) is above a predefined minimum PV voltage level that, for example, is greater than a corresponding minimum PPV voltage level. In one such embodiment, a temporary cache capacitor of cell 110 is unbiased during the PV strobe so that a PV strobe state of cell 110 is representative of the sensed threshold voltages output by cell 110 without the biasing charge held in the temporary cache capacitor. In some embodiments, a PV strobe is performed first, and a PPV strobe is subsequently performed—e.g., conditioned upon a result of the PV strobe.

In the illustrated example, sense amplifier circuitry 112 communicates to memory controller 130, for each of one or more target cells of a program verify process, a respective current PPV strobe state 122 and a respective current PV strobe state 124. Based on said PPV strobe state 122 and PV strobe state 124, memory controller 130 determines whether or not a given memory cell is fully programmed such that the cell has (or has not) yet reached a target threshold voltage representing intended data that should be stored in said cell. In some embodiments, for a not fully programmed target cell, memory controller 130 also uses that cell's current PPV strobe state 122 and PV strobe state 124 to determine how close the target cell is to a target threshold voltage. In this manner, the memory controller 130 can control one or more voltage levels of a subsequent programming pulse used on the not fully programmed target cell to prevent changing the electrical characteristics of that target cell too much such that a resulting threshold voltage of the target cell would exceed or overshoot the target threshold voltage.

In the illustrated example, the memory controller 130 uses a full program pulse 126 to program (e.g., change electrical characteristics of) one or more memory cells—including, for example, a target cell 110—which each have a respective threshold voltage that is relatively far away from a target threshold voltage. In one such embodiment, the example memory controller 130 implements Selective Slow Program Convergence (or "SSPC") wherein a partial program pulse 128 is used to program one or more memory cells each having a respective threshold voltage that is relatively close to a target threshold voltage. In this manner, electrical characteristics of memory cells that are relatively close to their intended target threshold voltages can be programmed in small increments using the partial program pulse 128 to avoid producing threshold voltages in those memory cells that exceed their intended target threshold voltages that correctly represent data intended to be stored therein. In addition, the electrical characteristics of memory cells that are relatively far away from their intended target threshold voltages can be programmed in larger increments using the full program pulse 126 to more quickly approach and reach the intended target threshold voltages.

In the illustrated example, the electrical characteristic of a memory cell 106 that is changed during a memory cell programming pass corresponds to a floating gate of a transistor in the memory cell 106. For example, to control the amount of electrical current flow between the drain and source terminals of the transistor of the memory cell 106, a program pulse (e.g., the full program pulse 126 or the partial program pulse 128) is used to change the electron charge on the floating gate of the transistor. Changing the electron charge changes the amount of electrical current that flows through the transistor of the memory cell 106. The amount of current flow is inversely proportional to a resulting threshold voltage level ($V_{TH}$) of that memory cell 106 which is, in turn, representative of the multi-bit binary value stored in that memory cell 106. As such, different multi-bit binary values can be stored in the memory cells 106 by using the full program pulse 126 or the partial program pulse 128 of FIG. 1 to change the electrical characteristics of the memory cells 106.

In the illustrated example of FIG. 1, if the sensed threshold voltage level of a target cell 110 is relatively close to a target threshold voltage such that a small program pulse is needed to configure the target cell 110 to reach the intended target threshold voltage, the memory controller 130 may use a partial program pulse 128 to further program the target cell 110 by causing a small incremental change to its electrical characteristics. Also in the illustrated example, if the sensed threshold voltage level of another targeted memory cell (other than cell 110) is relatively far from the intended target threshold voltage such that a larger program pulse is needed to configure the other target cell to reach the target threshold voltage, the memory controller 130 may further program the other target cell using the full program pulse 126 having a relatively higher voltage than the first partial program pulse 128. In this manner, the memory controller 130 can perform further programming on both of target cell 110 and the other target cell using respective program pulse voltage levels so that the threshold voltages output by the target cell 110 and the other target cell are representative of the intended data to be stored without overshooting or exceeding the target threshold voltages corresponding to that intended data. In addition, for target memory cells that have already reached their target threshold voltages, the memory controller 130 can inhibit (INH) further program pulses from being applied to those target memory cells during subsequent memory cell programming passes.

In the illustrated example, the memory controller 130 maintains or otherwise updates (and, for example, includes) cell state information 138 which is based on PPV strobe state 122, PV strobe state 124 and/or other such strobe state signaling from sense amplifier circuitry 112. In one such embodiment, cell state information 138 includes a PPV target cell map which memory controller 130 uses to store PPV strobe states each corresponding to a respective one of cells 106. For example, such a PPV target cell map holds respective one binary bits for each of one or more targeted ones of cells 106 representative of whether the sensed threshold voltage of that target cell exceeded a first "PPV" voltage level. Additionally or alternatively, cell state information 138 includes a PV target cell map which memory controller 130 uses to store PV strobe states each corresponding to a respective one of cells 106. For example, the PV target cell map holds respective one binary bits for each of one or more targeted ones of cells 106 representative of whether a second sensed threshold voltage of that target cell exceeded a second "PV" voltage level.

In the example embodiment shown, a detector 132 of memory controller 130 is coupled to receive one or more signals—e.g., including the illustrative signal 131 shown— which specify or otherwise indicate a state (actual or expected) of MBC memory 104 that is to exist at some point during a program verification process. For example, signal 131 is received by detector 132 from one or more temperature sensors, pressure sensors, and/or other such sensors (not shown) that are included in or coupled to system 100. In some embodiments, signal 131 is communicated to detector 132 from other circuitry of memory controller 130—e.g., where signal 131 specifies or otherwise indicates a relative position of a target memory cell with respect to one or more other memory cells of MBC memory 104. For example, in one such embodiment, signal 131 identifies a word line which includes the target memory cell.

Detector 132 comprises logic (e.g., including hardware and/or executing software) which identifies that a particular one of memory cells 106 is targeted for program verification. In an embodiment, such identification includes detector 132 determining a particular reference voltage level—e.g., one of a PV voltage level or a PPV voltage level—that is to be a basis for evaluating a threshold voltage of a transistor of the targeted memory cell. In response to detecting that program verification of the target memory cell is to take place, detector 132 generates a signal 133 which communicates to a signal generator 134 of memory controller 130 both the state which is indicated by signal 131 and a reference voltage level which is to be a basis for the program verification.

Signal generator 134 includes, has access to, or otherwise operates based on, configuration state 136 which specifies or otherwise indicates that each of multiple reference voltage indicators corresponds to a respective state of MBC memory 104. For example, configuration state 136—which includes, for example, a table, a linked list, a bitmap and/or any of various other suitable information resources—identifies a correspondence between a first indication of the reference voltage and a first possible state of MBC memory 104, between a second indication of the reference voltage and a second possible state of MBC memory 104, between a nth indication of the reference voltage and a nth possible state of MBC memory 104, and the like. Configuration state 136 is based, for example, on information which is provided by a manufacturer, distributor, retailer or other such entity—e.g., wherein configuration state 136 is programmed or otherwise configured by an administrator, developer, or other user. In one such embodiment, configuration state 136 is provided via a remote server or other resource which communicates with system 100 via one or more networks.

In response to signal 133, signal generator 134 accesses configuration state 136 to identify a particular indication of the reference voltage—e.g., wherein the indication is identified as corresponding to the state which is indicated by signal 131 (and signal 133). Based on such identifying, the indication of the reference signal is included in a signal 127 which memory controller 130 communicates to MBC memory 104. In an embodiment, signal 127 (or another input based on signal 127) is received at sense amplifier circuitry 112. Based on such input, sense amplifier circuitry 112 senses the threshold voltage of the targeted memory cell—e.g., to generate the current PPV strobe state 122, the current PV strobe state 124 or other such output to facilitate updating of cell state information 138.

Certain features of various embodiments are described herein in the context of some baseline verification state which, for example, is predefined as corresponding to a reference level $V_{CB0}$ of a boost voltage and/or a reference duration $T_{SEN0}$ of a sense time for detecting activation (if any) of a memory cell. Based on the detecting of some alternative verification state, said embodiments variously determine another level $V_{CB1}$ of the boost voltage, and/or another duration $T_{SEN1}$ of the sense time.

For example, in some embodiments, the baseline verification state comprises a reference word line that is associated with a value $WL_0$. The detected alternative verification state instead comprises another word line that is associated with a value $WL_1$ which, for example, indicates a distance between the other word line and the reference word line. In one such embodiment, the voltage level $V_{CB1}$ is calculated according to the following:

$$V_{CB1} = V_{CB0} + [(WL_1 - WL_0) \times (\Delta V_{WL})], \qquad \text{Equation 1}$$

where $\Delta V_{WL}$ is a predefined incremental voltage change for a given incremental difference between word lines (or groups of word lines). Additionally or alternatively, the time duration $T_{SEN1}$ is calculated according to the following:

$$T_{SEN1} = T_{SEN0} + [(WL_1 - WL_0) \times (\Delta T_{WL})], \qquad \text{Equation 2}$$

where $\Delta T_{WL}$ is a predefined incremental amount of a time change for a given incremental difference between word lines (or groups of word lines).

In some embodiments, values $WL_0$, $WL_1$ each correspond to a different respective one (and only one) word line. Alternatively, values $WL_0$, $WL_1$ each correspond to a different respective plurality of word lines. For example, some embodiments configure a boost voltage or a sense time parameter at a granularity level which corresponds to a size (e.g., sixteen) of a group of multiple word lines. In one such embodiment, each word line in a first group of sixteen word lines WL(0) through WL(15) corresponds to the number $WL_0$—e.g., wherein each word line in a different group of sixteen word lines corresponds to the number $WL_1$. The different group of word lines is, for example, one of a second group of word lines WL(16) through WL(31), a third group of word lines WL(32) through WL(47), etc.

In another embodiment, the baseline verification state comprises the memory device having a temperature $K_0$—e.g., wherein the detected alternative verification state comprises the memory device instead having another temperature $K_1$. In one such embodiment, the voltage level $V_{CB1}$ is calculated according to the following:

$$V_{CB1} = V_{CB0} + [(K_1 - K_0) \times (\Delta V_K)], \quad \text{Equation 3}$$

where $\Delta V_K$ is a predefined incremental voltage change for a given incremental change to the memory device temperature. Additionally or alternatively, the time duration $T_{SEN1}$ is calculated according to the following:

$$T_{SEN1} = T_{SEN0} + [(K_1 - K_0) \times (\Delta T_K)], \quad \text{Equation 4}$$

where $\Delta T_K$ is a predefined incremental amount of a time change for a given incremental change to the memory device temperature.

In still other embodiment, the baseline verification state comprises the memory device having a wear level $W_0$ (such as a number of program-erase cycles)—e.g., wherein the detected alternative verification state comprises the memory device having a wear level $W_1$. In one such embodiment, the voltage level $V_{CB1}$ is calculated according to the following:

$$V_{CB1} = V_{CB0} + [(W_1 - W_0) \times (\Delta V_W)], \quad \text{Equation 5}$$

where $\Delta V_W$ is a predefined incremental voltage change for a given incremental change to the memory device's level of wear. Additionally or alternatively, the time duration $T_{SEN1}$ is calculated according to the following:

$$T_{SEN1} = T_{SEN0} + [(W_1 - W_0) \times (\Delta T_W)], \quad \text{Equation 6}$$

where $\Delta T_W$ is a predefined incremental amount of a time change for a given incremental change to the memory device's level of wear.

Figure 2:
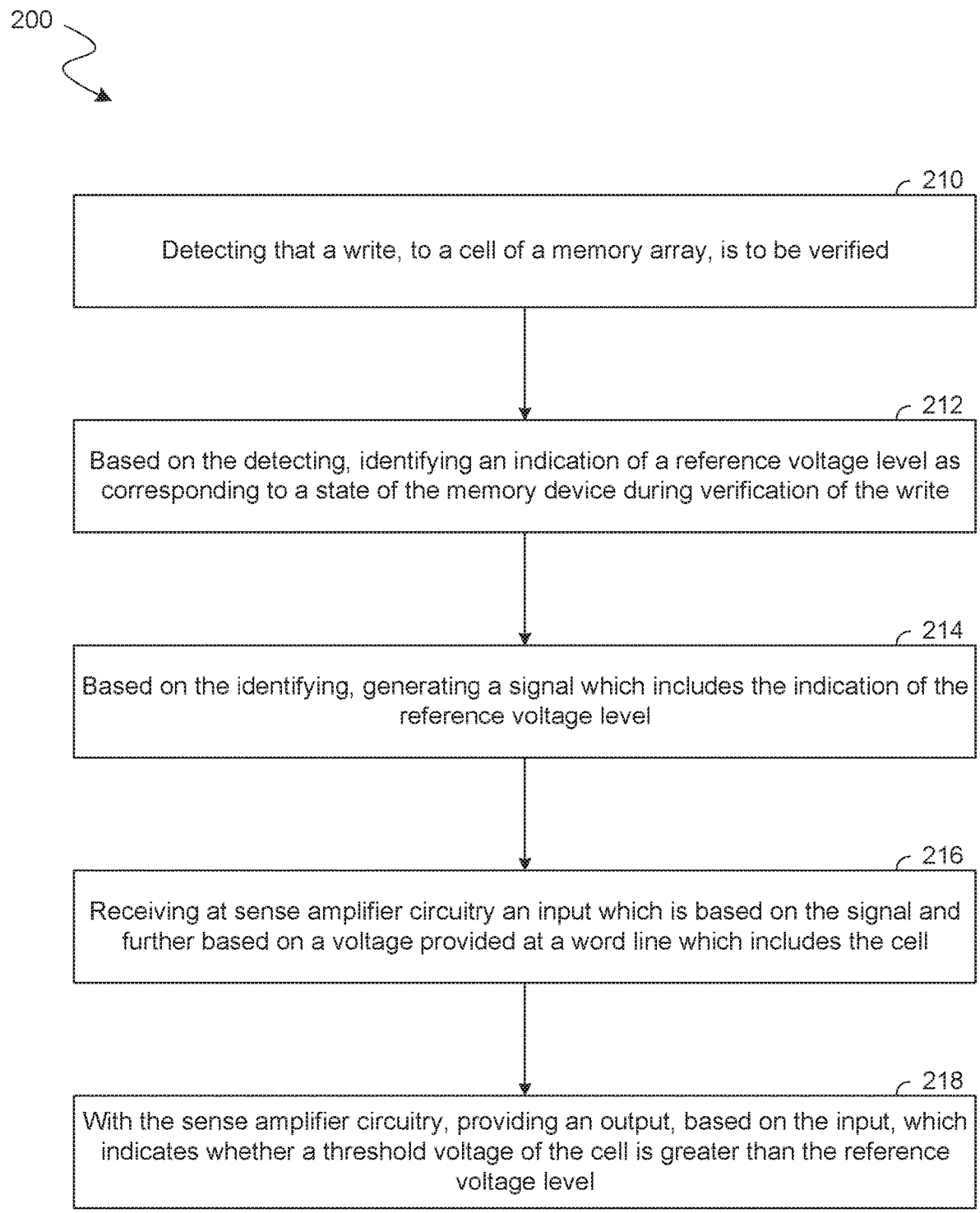
FIG. 2 illustrates a flow diagram showing features of a method to verify programming of a multi-level cell memory according to an embodiment.

FIG. 2 shows features of a method 200 to verify the programming of a memory cell according to an embodiment. Method 200 is one example of an embodiment wherein sense amplifier circuitry facilitates program verification based on a signal (other than a voltage provided to a word line) which includes an indication of a reference voltage that is to be a basis for evaluating a currently programmed threshold voltage of a memory cell. A determination that the particular indication is to be communicated with the signal—e.g., as opposed to the signal communicating some different indication of the same reference voltage—is made based on a detected state of the memory device. In some embodiments, method 200 is performed with memory controller 130 and/or circuitry that otherwise provides functionality of system 100.

As shown in FIG. 2, method 200 includes (at 210) detecting that a write, to a cell of a memory array, is to be verified. In some embodiments, the detecting at 210 is based on communications by a memory controller with a processor (or other such host logic) and/or with a memory device which includes the memory array. In one such embodiment, the detecting is based on a memory device signaling a completion (actual or expected) of a program pulse or other operation to change a threshold voltage of a transistor at the memory cell.

Method 200 further comprises (at 212) identifying, based on the detecting at 210, that an indication of a reference voltage level corresponds to a state of the memory device during the verification of the write. The state includes one of (and, in some embodiments, a combination of at least two of) a thermal condition at the memory array, a pressure condition at the memory array, a wear condition of the memory array, or a relative position of the cell with respect to one or more other cells of the memory array. The wear condition is represented, for example, by a number of program-erase (P-E) cycles that have been performed in the memory device. Alternatively or in addition, the relative position of the cell is indicated, for example, by a number of a word line which includes the cell.

In some embodiments, the identifying at 212 is based on a number—e.g., the number $WL_1$ in either of Equations 1 and 2—which (for example) is used to determine a value indicating a distance between a reference word line and a word line which includes the cell. The number corresponds to a particular word line (or, for example, corresponds to each word line of a particular group of word lines). The identifying at 212 includes performing a look-up, calculation or other operation which results in one particular indication of the reference voltage being communicated in lieu of an alternative indication of the same reference voltage. In one such embodiment, the identifying at 212 is performed with a memory controller which includes or otherwise has access to some predefined configuration state—e.g., a look-up table or other reference information—which specifies or otherwise indicates a correspondence of various possible states of the memory device each with a different respective indication of the same reference voltage.

Method 200 further comprises (at 214) generating a signal, based on the identifying at 212, which includes the indication of the reference voltage level. The signal is distinguished, for example, from a word line voltage which, during the program verification, is provided to a word line that includes the cell. By way of illustration and not limitation, the signal is communicated to one of the memory array or the sense amplifier via a path which omits said word line. Alternatively or in addition, the word line voltage omits an indication of the reference voltage.

In an illustrative embodiment, the signal (or an input which is generated based on the signal) includes a boost voltage that is provided at a capacitor of the sense amplifier circuitry. In another embodiment, the signal (or an input which is generated based on the signal) includes a control signal to operate a switch of the sense amplifier circuitry—e.g., wherein the indication of the reference voltage level includes a period of time during which the control signal is asserted. In still another embodiment, the signal (or an input which is generated based on the signal) includes a bit line voltage which, during the program verification, is provided to a bit line that includes the cell.

In some embodiments method 200 further comprises operations of sense amplifier circuitry that is coupled to the memory array. For example, method 200 further comprises (at 216) receiving an input at such sense amplifier circuitry, where the input is based on the signal and further based on a voltage provided at a word line which includes the cell. The input includes, for example, one of a boost voltage, a switch control signal, or a current exchanged with a bit line which includes the cell. In one such embodiment, method 200 further comprises (at 218) the sense amplifier circuitry providing an output, based on the input, which indicates whether a threshold voltage of the cell is greater than the reference voltage level. For example, the input contributes to the determining of a voltage across a capacitor of the sense amplifier—e.g., wherein the output is generated based on a sampling of said voltage. In various embodiments, method 200 omits—but provides the signal generated at 214 to facilitate—the receiving at 216 and the providing at 218.

Figure 3:
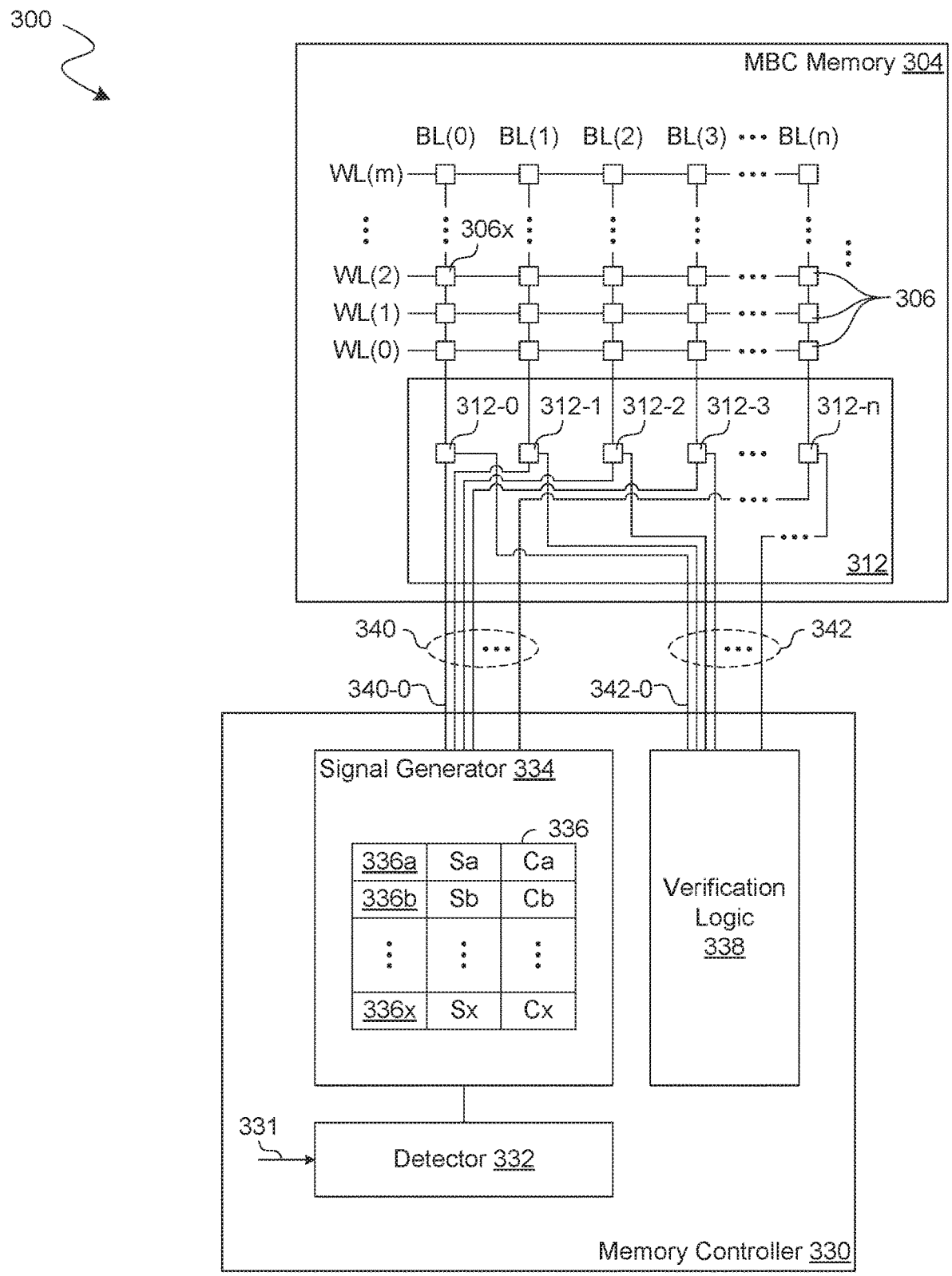
FIG. 3 illustrates a functional block diagram showing features of a system to facilitate program verification according to an embodiment.

FIG. 3 shows features of a system 300 to perform memory cell program verification according to an embodiment. System 300 illustrates one example of an embodiment wherein a signal, which is to facilitate a program verification, includes an indication of a reference voltage level, where the indication is determined based on one or more of a word line of a target cell, an environmental condition (e.g., including a temperature or an atmospheric pressure), or a level of wear of a memory device. In various embodiments, system 300 includes features of system 100—e.g., where functionality of system 300 is provided according to method 200.

As shown in FIG. 3, system 300 includes a MBC memory 304 and a memory controller 330 coupled to access MBC memory 304 on behalf of a processor or other host logic (not shown) which is included in—or alternatively, is to couple to—system 300. In some embodiments, memory controller 330 and MBC memory 304 variously provide at least some functionality of memory controller 130 and MBC memory 104, respectively. In one such embodiment, MBC memory 304 stores, for example, three bits-per-cell (3bpc) based on eight threshold voltage levels ($V_{TH}$), such the illustrative voltage levels L0-L7 shown in the threshold voltage distribution 102 of FIG. 1.

As shown in the illustrated example, the MBC memory 304 includes a plurality of word lines WL(0), WL(1), WL(2), ..., WL(m) and bit lines BL(0), BL(1), BL(2), BL(3), ..., BL(n). In the illustrated example, the variable 'm' represents the total number of word lines or pages in the MBC memory 304, and the variable 'n' represents the memory cell width (e.g., total number of memory cells 306) of each word line or page of the MBC memory 304. The example memory cells 306 are variously located at respective intersections of the word lines WL(0), ..., WL(m) and bit lines BL(0), ..., BL(n). Each memory cell 306 is accessed by activating (e.g., precharging) a corresponding one of the word lines (WL) and a corresponding one of the bit lines (BL). In this manner, precharging the word line (WL) applies a gate-to-source voltage ($V_{gs}$) to a gate terminal of a transistor of the desired memory cell 306, which allows electrical current to flow between a drain terminal and a source terminal of the desired memory cell 306. The programmed electrical characteristics of the memory cell 306 control the amount of electrical current flow between the drain and source terminals when the corresponding bit line (BL) is precharged. The amount of electrical current flow corresponds to a threshold voltage level of the memory cell 306. As such, different multi-bit binary values can be stored in the memory cells 306 by programming the transistors of the memory cells 306 to allow more or less electrical current to flow between corresponding drain and source terminals to control the threshold voltage levels output from the memory cells 306.

In the illustrated example, the electrical characteristic of a memory cell 306 that is changed during a memory cell programming pass corresponds to a floating gate of a transistor in the memory cell 306. By way of illustration and not limitation, to control the amount of electrical current flow between the drain and source terminals of the transistor of the memory cell 306, a programming pulse (e.g., the full programming pulse 126 or the partial programming pulse 128 of FIG. 1) is used in some embodiments to change the electron charge on the floating gate of the transistor. Changing the electron charge changes the amount of electrical current that flows through the transistor of the memory cell 306. The amount of current flow is proportional to a resulting threshold voltage level ($V_{TH}$) of that memory cell 306 which is, in turn, representative of the multi-bit binary value stored in that memory cell 306. As such, different multi-bit binary values can be stored in the memory cells 306 by using a programming pulse to change the electrical characteristics of the memory cells 306.

In the illustrated example, during a write process, the memory controller 330 receives write data from a processor. The write data may be data from a user or from a process executed with one or more processors. During the write process, the memory controller 330 variously performs a respective one or more memory cell programming passes on selected ones of memory cells 306 to store the write data. Subsequently, memory controller 330 performs one or more program verify operations to confirm that the write data is correctly written to corresponding ones of the memory cells 306 as intended. To perform program verify operations such as those of the examples disclosed herein, the memory controller 330 collects strobe state information (e.g., such as the PPV strobe state 122 and the PV strobe state 124 described above in connection with FIG. 1). The strobe state information collected during a particular program verify operation correspond to a targeted threshold voltage level—e.g., one of the threshold voltage levels ($V_{TH}$) L0-L7 of the threshold voltage distribution 102—that is being verified during that program verify operation.

For example, the MBC memory 304 of the illustrated example includes sense amplifier circuitry 312 to facilitate program verify operations which determine whether intended data is correctly written to the memory cells 306. For example, sense amplifier circuitry 312 comprises sense amplifiers 312-0, 312-1, 312-2, 312-3, ... 312-4 which are each coupled to a respective one of bit lines BL(0), ..., BL(n). To verify the programming of a given one of memory cells 306, a corresponding word line (WL) and bit line (BL) are activated, and a corresponding one of sense amplifiers 312-0, 312-1, 312-2, 312-3, ... 312-4 senses a current threshold voltage of said cell—e.g., where such sensing is based on a current, voltage and/or other electrical characteristic of the corresponding activated BL.

Based on such sensing by a given one of sense amplifiers 312-0, 312-1, 312-2, 312-3, ... 312-4, a respective signal is communicated back to memory controller 330 to indicate a result of a programming verification operation for a respective targeted memory cell at a corresponding one of bit lines BL(0), ..., BL(n). In the example embodiment shown, signals 342 are variously communicated each from a respective one of sense amplifiers 312-0, 312-1, 312-2, 312-3, ... 312-4 to verification logic 338 of memory controller 330. In one such embodiment, each of signals 340 indicates (for example) whether, for a corresponding memory cell which is targeted by a verification operation, a current threshold voltage ($V_{TH}$) of the targeted memory cell is above a particular reference voltage level such as a program verify (PV) level or a pre-program verify (PPV) level.

In various embodiments, sensing such as that to generate one of signals 340 is based on a signal (referred to herein as a "reference signal") which includes an indication of a particular reference voltage with which the cell's current threshold voltage is to be compared or otherwise evaluated. For example, a signal generator 334 of memory controller 330 generates signals 340 which are variously provided each to a respective one of sense amplifiers 312-0, . . . , 312-n. In one such embodiment, for each of signals 340, the signal includes an identifier or other indication of a respective reference threshold voltage, which a corresponding one of sense amplifiers 312-0, . . . , 312-n is to use as a basis to verify programming of a cell in a corresponding one of bit lines BL(0), . . . , BL(n).

As detailed herein, the indication of a particular reference voltage level by a given one of signals 340 is determined based on one or more of a word line of a targeted memory cell, an environmental condition (e.g., including a temperature or an atmospheric pressure), or a level of wear of MBC memory 304. Additionally or alternatively, said indication of a reference voltage level is communicated with one of signals 340 independent of—e.g., and in addition to—a voltage which actives the word line corresponding to the targeted memory cell.

In the example embodiment shown, memory controller 330 comprises a detector 332 to receive a signal 331, and a signal generator 334, coupled to detector 332, which includes or otherwise has access to a table 336. For example, signal 331, detector 332, signal generator 334, and table 336 correspond functionally to signal 131, detector 132, signal generator 134, and configuration state 136 (respectively). Detector 332 is configured to detect that a particular one of memory cells 306—e.g., memory cell 306x—is targeted for program verification. In response, detector 332 communicates to signal generator 334 both the state which is indicated by signal 331, and a reference voltage level which is to be a basis for the program verification. Responsive to detector 332, signal generator 334 performs a look-up of table 336 to identify an indication of the reference voltage level, where such indication is identified as corresponding to a state of MBC memory 304 which is indicated by signal 331.

By way of illustration and not limitation, table 336 includes entries 336a, 336b, . . . , 336x which identify respective possible states Sa, Sb, . . . , Sx of MBC memory 304 as corresponding each to a respective one of values Ca, Cb, . . . , Cx (which, in turn, each represent a respective voltage level). Based on an identified one of values Ca, Cb, . . . , Cx, the corresponding indication of the reference voltage is communicated (for example) in a signal 340-0 of the signals 340 that are variously generated by signal generator 334.

In an illustrative scenario according to one embodiment, programming of a memory cell 306x is verified by activating both the word line WL(2) and the bit line BL(0) which each include memory cell 306x. Such activation results in a current at bit line BL(0) which, for example, contributes at least in part to an amount of a voltage across a capacitor (not shown) of the sense amplifier 312-0 which is coupled to bit line BL(0). In one such embodiment, the amount of the voltage across such a capacitor is further based on a signal 340-0 which is to facilitate program verification for memory cells 306x. Based on an amount of said capacitor voltage, sense amplifier 312-0 outputs a signal 342-0 which is provided to verification logic 338. For example, sense amplifier circuit 312-0 latches a binary zero or one to indicate an evaluation result for result the currently programmed threshold voltage of cell 306x.

In some embodiments, verification of a first write to a first memory cell (such as memory cell 306x) comprises multiple evaluations each of the same currently programmed threshold voltage of the targeted memory cell. Two or more such evaluations are based on a different respective reference voltage levels—e.g., each evaluation to detect whether the currently programmed threshold voltage is greater than the respective reference voltage level.

For example, in some embodiments, verifying a programming of cell 306x is based on signal 340-0 communicating a first indication of a first reference voltage to facilitate a first sampling with sense amplifier 312-0. Verifying the programming of cell 306x is further based on signal 340-0 communicating a second indication of a second reference voltage to facilitate a second sampling with sense amplifier 312-0. In one such embodiment, the first indication and the second condition are variously selected for communication, via signal 340-0, based on the same state which is indicated by signal 331.

Additionally or alternatively, multiple program verifications are based on different respective indications of the same reference voltage level. For example, based on a first state of MBC memory 304, signal generator 334 selects a first indication of a given reference voltage for communication (via signal 340-0) to facilitate a first program verification. By contrast, signal generator 334, based on a different state of MBC memory 304, instead selects a second indication of the same reference voltage for communication in signal 340-0 (or another one of signals 340) to facilitate a second program verification.

In one such embodiment, a first program verification and a second program verification are each for the same memory cell—e.g., where the first indication and the second indication are variously selected based on different respective thermal conditions (e.g., temperatures) at MBC memory 304, or based on different respective pressure conditions at MBC memory 304.

In an example embodiment, the first indication includes a first change to a boost voltage provided at a capacitor of sense amplifier circuitry 312-0, wherein the second indication includes a second change to said boost voltage. In one such embodiment, the first change and the second change are based on a first temperature and a second temperature, respectively—e.g., wherein the second temperature is greater than the first temperature, and wherein the first change is smaller than the second change.

In another example embodiment, the first indication includes a first change to a boost voltage provided at a capacitor of sense amplifier circuitry 312-0, wherein the second indication includes a second change to said boost voltage. In one such embodiment, the first change and the second change are based on a first pressure and a second pressure, respectively—e.g., wherein the second pressure is greater than the first pressure, and wherein the first change is larger than the second change.

Alternatively, a first program verification and a second program verification are for a first memory cell and a second memory cell (respectively)—e.g., where a first indication of a reference voltage is selected based on a relative position of the first memory cell in the memory array, and a second indication for the same reference voltage is selected based on a relative position of the second memory cell in the memory array.

In one such embodiment, a first word line and a second word line include the first memory cell and the second memory cell (respectively). The first indication includes (for example) a first change to a boost voltage provided at a capacitor of sense amplifier circuitry 312, wherein the second indication includes a second change to another such boost voltage. The first change is based on a relative position of the first memory cell in the memory array, and the second change is based on a relative position of the second memory cell in the memory array. For example, the first word line is electrically coupled between the second word line and sense amplifier circuitry 312—e.g., wherein the first change is larger than the second change.

Figure 4:
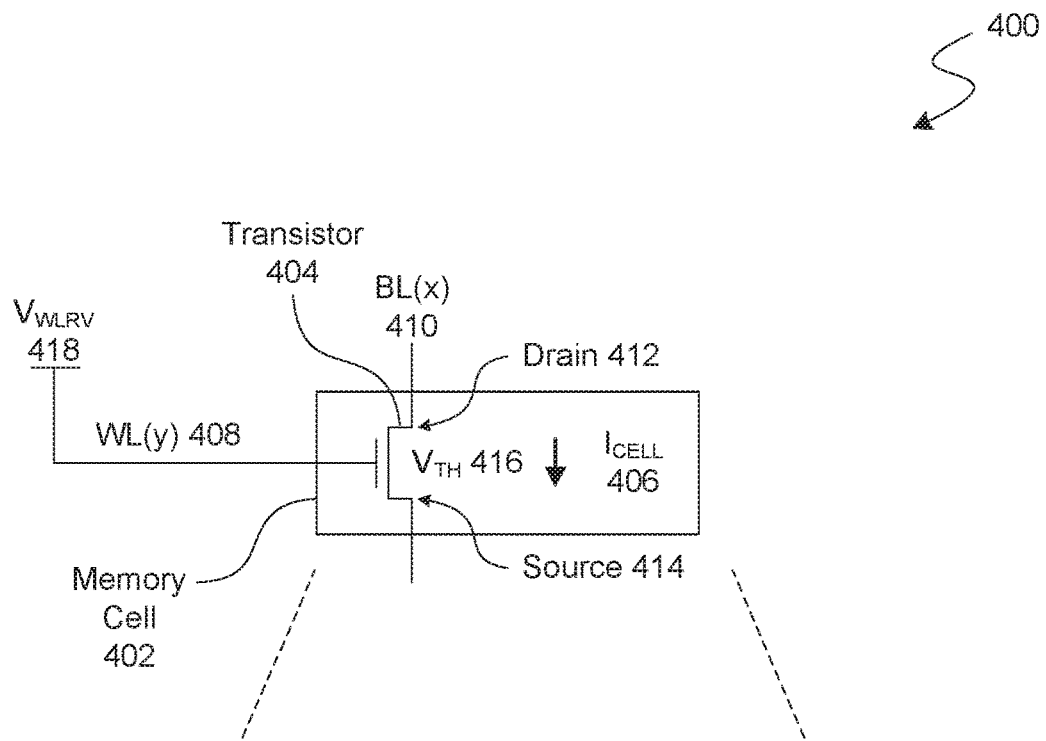
FIG. 4 illustrates a graph showing electrical characteristics of a memory cell with which program verification is performed according to an embodiment.
Figure 4:
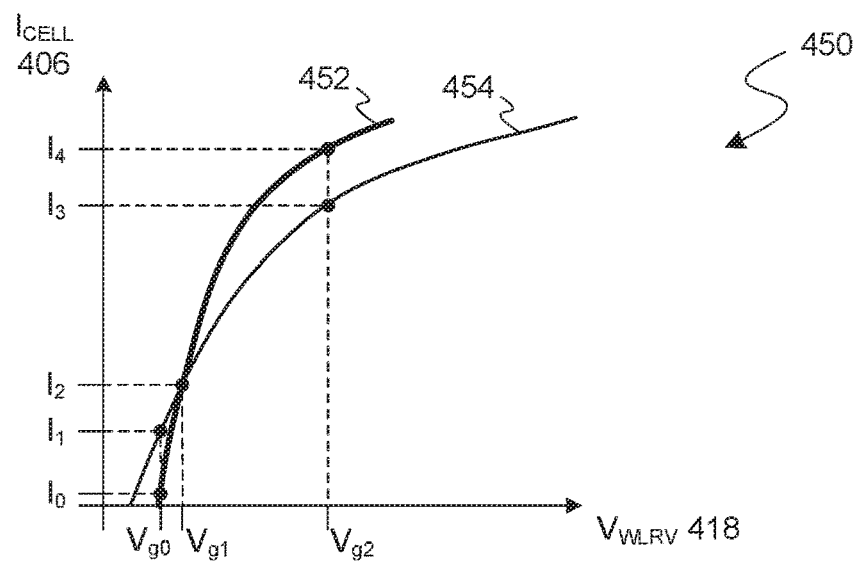

FIG. 4 shows a memory cell 402 of an MBC memory 400 according to an embodiment, as well as a graph 450 illustrating an example of electrical current-voltage (I-V) characteristics of a transistor 404 of memory cell 402. In some embodiments, MBC memory 400 includes features of MBC memory 104 or MBC memory 304—e.g., wherein memory cell 402 facilitates program verification which is performed according to method 200.

The graph 450 shows an example memory cell electrical current ($I_{CELL}$) 406, through the transistor 404, as a function of different word line read-verify voltages ($V_{WLRV}$) 418 applied, via a word line WL(y) 408, to a gate terminal of the transistor 404. As shown in the illustrated example, the memory cell electrical current ($I_{CELL}$) 406 flows along a bit line BL(x) 410 between a drain terminal 412 and a source terminal 414 of the transistor 404.

Graph 450 shows two plots 452, 454 which (for example) are for transistors of different respective memory cells or, alternatively, for the same transistor under various operational conditions at different times. Plot 452 illustrates I-V characteristics of a transistor for which cell current $I_{CELL}$ 406 transitions between current levels $I_0$, $I_4$ as word line read-verify voltage ($V_{WLRV}$) 418 is transitioned between a voltage level $V_{g0}$ and a voltage level $V_{g2}$ which is greater than voltage level $V_{g0}$. By contrast, plot 454 illustrates other I-V characteristics of a transistor for which cell current $I_{CELL}$ 406 transitions between current levels $I_1$, $I_3$ for a similar transition of $V_{WLRV}$ 418 between voltage levels $V_{g0}$, $V_{g2}$.

In an illustrative scenario, voltage level $V_{g0}$ is at or near the threshold voltage ($V_{TH}$) 416 of transistor 404—e.g., wherein current level $I_0$ is at or near 0 amperes (A). Accordingly, the memory cell current ($I_{CELL}$) 406 through the memory cell 402 increases as the word line read-verify voltage ($V_{WLRV}$) 418 applied to the gate terminal of the transistor 404 increases further away from the threshold voltage ($V_{TH}$) 416 of the transistor 404.

In various embodiments, operations to verify a programming of memory cell 402 include, or are otherwise based on, an application of a particular level of the word line read-verify voltage ($V_{WLRV}$) 418 to the gate terminal of transistor 404. The applied level of word line read-verify voltage ($V_{WLRV}$) 418 contributes to a corresponding level of cell current $I_{CELL}$ 406, which in turn contributes to the generation of a voltage across a capacitor of a sense amplifier (not shown) which is coupled to bit line BL(x) 410. In one such embodiment, an amount of said capacitor voltage is based both on the applied level of level of the word line read-verify voltages ($V_{WLRV}$) 418, and on a signal—such as one of signals 340, for example—which includes an indication of a reference voltage level. The capacitor voltage is subsequently sampled to detect, for example, whether the applied level of word line read-verify voltage ($V_{WLRV}$) 418 exceeds the reference voltage level which is indicated by said other signal.

As compared to plot 454, plot 452 exhibits a relatively steep slope, at least in a range between voltage levels $V_{g0}$, $V_{g2}$. For example, plots 452, 454 cross each other at a current level $I_2$ which corresponds to a voltage level $V_{g1}$ between voltage levels $V_{g0}$, $V_{g2}$—e.g., where current level $I_0$ is less than current level $I_1$ and/or current level $I_4$ is greater than current level $I_3$.

In one example scenario, the difference between the respective slopes of plots 452, 452 is due at least in part to the different positions of two transistors in a memory array. For example, in some embodiments, plot 452 corresponds to a first transistor of a first memory cell of MBC memory 400, where plot 454 instead corresponds to a second transistor of a second memory cell of MBC memory 400. A first word line and a first bit line each include said first memory cell—e.g., wherein a first sense amplifier is coupled to sense a current of the first bit line. Similarly, a second word line and a second bit line each include said second memory cell—e.g., wherein a second sense amplifier is coupled to sense a current of the second bit line. In one such embodiment, plot 452 is more steep than plot 454 due at least in part to the first word line (and accordingly, the first memory cell) being closer to the first sense amplifier than the second word line (or the second memory cell) is to the second sense amplifier. In this particular context, "closer" refers to the characteristic of relatively fewer memory cells being electrically coupled, along a given bit line, between a given memory cell and sense amplifier circuitry which is coupled to the given bit line. For example, n1 is a total number of memory cells—if any—which are electrically coupled, on the first bit line, between the first memory cell and the first sense amplifier. Similarly, n2 is a total number of memory cells which are electrically coupled, on the second bit line, between the second memory cell and the second sense amplifier. In one such embodiment, n1 is less than n2. Although some embodiments are not limited in this regard, the first bit line and the second bit line are different (or alternatively, the same) bit lines, and/or the first sense amplifier and the second sense amplifier are different (or the same) sense amplifiers.

Alternatively or in addition, the difference between the respective slopes of plots 452, 454 is due at least in part to different operational conditions under which the same one transistor is operated at various times. For example, in various embodiments, plot 452 represents I-V characteristics of memory cell 402 during a first operational state of MBC memory 400—e.g., wherein plot 454 represents I-V characteristics of memory cell 402 during a second operational state of MBC memory 400. In one such embodiment, the first operational state includes a first temperature of MBC memory 400 the second operational state includes a corresponding second temperature of MBC memory 400 which (for example) is higher than the first temperature. Additionally or alternatively, the first operational state includes a first level of an atmospheric (or other) pressure at the MBC memory 400, and the second operational state includes a second level of the pressure which—for example—is lower than the first level. Additionally or alternatively, the first operational state includes a first level of wear of MBC memory 400, and the second operational state includes a corresponding second level of wear of MBC memory 400 which (for example) is more than the first level of wear.

As described herein, program verification according to some embodiments is based at least in part on a signal—other than a word line voltage—which includes an indication of a reference voltage. In one such embodiment, the particular indication to communicate with said signal is selected or otherwise determined based on the proximity of a targeted memory cell to a corresponding sense amplifier (e.g., the proximity indicated by the word line which includes the targeted memory cell). Additionally or alternatively, the particular indication to communicate with said signal is selected or otherwise determined based on a thermal condition (e.g., including a temperature), a pressure and/or a level of wear of a memory device.

Figure 5:
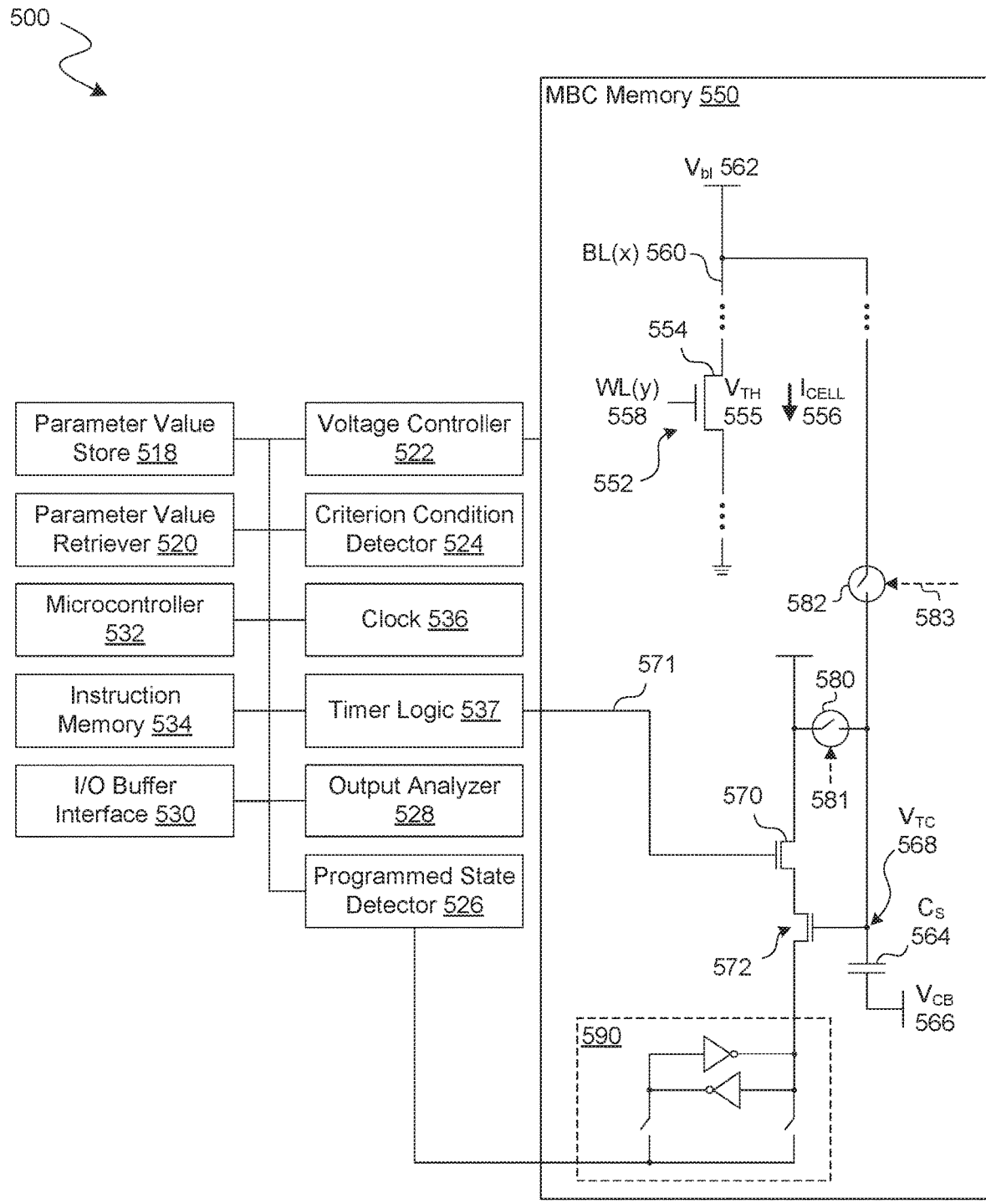
FIG. 5 illustrates a hybrid functional block/circuit diagram showing features of a system including a circuitry to provide program verification functionality according to an embodiment.

FIG. 5 shows features of a system 500 to verify memory programming according to an embodiment. In various embodiments, system 500 includes features of system 100, system 300 or memory device 400—e.g., where functionality of system 500 is provided according to method 200. As shown in FIG. 5, system 500 includes a MBC memory 550 and circuitry, coupled thereto, which is to verify a programming of one or more memory cells of MBC memory 550.

The system 500 of the illustrated example is configured to verify a programmed state of a memory cell 552 (e.g., one of memory cells 106 in FIG. 1) in memory 550, where such verifying is based on a voltage which is applied at a word line WL(y) 558 which includes memory cell 552. The verifying is further based on a signal—distinct from the voltage applied at word line WL(y) 558—which includes an indication of a reference voltage. In one such embodiment, a selection (or other such determination) of the indication to be included in the signal is made based on one of a thermal condition at the MBC memory 550, a pressure condition at the MBC memory 550, a wear condition of the MBC memory 550, or a number of memory cells (if any) which are electrically coupled between memory cell 552 and a corresponding sense amplifier.

In an embodiment, system 500 provides functionality of both memory controller 130 and MBC 104, for example. In various embodiments, although some circuitry of the system 500 provides functionality of memory controller 130, system 500 instead omits (but is configured to couple to, and operate with) MBC memory 550.

The illustrated example of FIG. 5 shows a transistor 554 of the memory cell 552 in the MBC memory 550. The illustrated example of FIG. 5 also shows how the memory cell 552 is in circuit with a corresponding sense amplifier which, in the illustrated example, includes a capacitor ($C_S$) 564 and switch circuitry (e.g., including some or all of the illustrative switches 570, 572, 580, 582 shown) that is coupled to facilitate a selective charging and sampling of capacitor ($C_S$) 564.

In the illustrated example, when the memory cell 552 is activated with a word line read-verify voltage ($V_{WLRV}$) on the word line WL(y) 558 and with a bit line precharge voltage ($V_{bl}$) 562 (e.g., ~0.4V) on the corresponding bit line BL(x) 560, the memory cell electrical current ($I_{CELL}$) 556 starts to flow through the memory cell 552, which contributes to a change to an amount of charge in (and thus, a voltage across) the capacitor ($C_S$) 564. In an illustrative scenario according to one embodiment, an amount of voltage change across the capacitor ($C_S$) 564 over a given time is determined at least in part by a currently programmed threshold voltage ($V_{TH}$) 555 of the transistor 554. If a difference between the word line read-verify voltage ($V_{WLRV}$) and the programmed threshold voltage ($V_{TH}$) 555 is large, the memory cell electrical current ($I_{CELL}$) 556 is proportionally high. If the voltage difference is small, the memory cell electrical current ($I_{CELL}$) 556 is proportionally low.

By controlling the sense amplifier to sense the voltage across the capacitor ($C_S$) 564—where the sensing is based on an additional signal which indicates a reference voltage level (e.g., one of a PV voltage level or a PPV voltage level)—the system 500 can determine or otherwise evaluate the programmed threshold voltage ($V_{TH}$) 555 of the memory cell 552. Example Equation 7 below shows the relationship between the memory cell electrical current ($I_{CELL}$) 556, the capacitance ($C_S$) of capacitor 564, a sense time ($T_{SEN}$), and a threshold voltage ($V_{TP}$) of a PMOS transistor 572 in the sense amplifier.

$$I_{CELL} \propto [C_S \cdot V_{TP}]/T_{SEN} \qquad \text{Equation 7}$$

In example Equation 7 above, the sense time ($T_{SEN}$) is a duration needed by the capacitor ($C_S$) 564 to develop sufficient voltage to trip the PMOS transistor 572 in the sense amplifier. In the illustrated example of FIG. 5, the threshold voltage ($V_{TP}$) of the PMOS transistor 572 is a trip voltage of the sense amplifier. According to example Equation 7, the sense time ($T_{SEN}$) needed to sense the programmed threshold voltage ($V_{TH}$) 555 is expressed as the product of a capacitance of the capacitor ($C_S$) 564 and the threshold voltage ($V_T$) of the PMOS transistor 572 in the sense amplifier divided by the memory cell electrical current ($I_{CELL}$) 556. In one such embodiment, where activation of PMOS transistor 572 with the threshold voltage ($V_T$) is indicative of a corresponding activation of the transistor 554 of memory cell 552

Availing of the relationship indicated in Equation 7, some embodiments perform programming verification—e.g., for different memory cells or for the same memory cell under different condition—by providing a signal, as a basis for charging and/or sampling capacitor ($C_S$) 564, which includes an indication of a reference voltage. The indication is included in the signal based on one of a thermal condition at the MBC memory 550, a pressure condition at the MBC memory 550, a wear condition of the MBC memory 550, or a number of memory cells (if any) which are electrically coupled between memory cell 552 and the sense amplifier.

By way of illustration and not limitation, circuitry of system 500 is pre-programmed or otherwise configured, in some embodiments, to associate a first operational condition with current ($I_{CELL}$) 556 being at a first current level $I_{CELL\_1}$ when a particular voltage level $V_G$ is provided at a gate terminal of memory cell 552. Such circuitry further associates a second operational condition with current ($I_{CELL}$) 556 being at a second current level $I_{CELL\_2}$ when voltage level $V_G$ is provided at the gate terminal of another memory cell (or, alternatively, of memory cell 552). In one example scenario, the current levels $I_{CELL\_1}$, $I_{CELL\_2}$, and voltage level $V_G$ are (respectively) the current levels $I_3$, $I_4$, and voltage level $V_{g2}$ in graph 450 of FIG. 4.

In various embodiments, the first current level $I_{CELL\_1}$ is represented (for example) by Equation 8 below:

$$I_{CELL1} = k[C_S \cdot V_{TP}]/T_{SEN\_1}, \qquad \text{Equation 8}$$

where k is a constant, and $T_{SEN\_1}$ is a time duration to allow for activation of PMOS transistor 572 based on current ($I_{CELL}$) 556 being at the first current level $I_{CELL\_1}$. In one such embodiment, an approximation of the second current level $I_{CELL\_2}$ can be represented (for example) as shown in Equation 9 below:

$$I_{CELL2} \approx k[C_S \cdot (V_{TP} + \Delta V_{1\text{-}2})]/T_{SEN\_1}, \qquad \text{Equation 9}$$

where a voltage differential $\Delta V_{1\text{-}2}$ is provided to account for the difference between the first and second operational conditions (and the corresponding difference between current levels $I_{CELL\_1}$, $I_{CELL\_2}$). In one such embodiment, an indication of the voltage differential $\Delta V_{1\text{-}2}$ is selected to be included in a signal which is then communicated to adjust or otherwise determine a voltage across capacitor ($C_S$) 564—e.g., wherein the signal results in voltage differential $\Delta V_{1\text{-}2}$ being applied at the boost voltage node $V_{CB}$ 566 shown.

Alternatively or in addition, another approximation of the second current level $I_{CELL\_2}$ can be represented as shown in Equation 10 below:

$$I_{CELL\_2} \approx k[C_S \cdot V_{TP}]/(T_{SEN\_1} + \Delta T_{1-2}),\qquad \text{Equation 10}$$

where $\Delta T_{1-2}$ is a sensing time differential that which similarly accounts for the difference between the first and second operational conditions. In one such embodiment, an indication of the sensing time differential $\Delta T_{1-2}$ is selected to be included in a signal which is then communicated (for example) to adjust or otherwise determine a length of time during which current ($I_{CELL}$) 556 is allowed to contribute to a change to the charge in—and accordingly, the voltage across—capacitor ($C_S$) 564.

The example system 500 of FIG. 5 uses a signal—e.g., including a switch control signal or a boost voltage signal—to control a voltage across capacitor ($C_S$) 564. Said voltage is based on a combination both the signal and a word line voltage which is applied, via word line WL(y) 558, to a gate terminal of transistor 554. Based on the signal, the sense amplifier senses the currently programmed threshold voltage ($V_{TH}$) 555 of the memory cell 552—e.g., wherein a resulting output from the sense amplifier indicates whether threshold voltage ($V_{TH}$) 555 is greater than a reference voltage which is indicated by the signal.

In the illustrated example, circuitry of system 500 to support program verification includes an example timer logic 537, an example parameter value store 518, an example parameter value retriever 520, an example voltage controller 522, an example criterion condition detector 524, an example programmed state detector 526, an example output analyzer 528, an example I/O buffer interface 530, an example microcontroller 532, and an example instruction memory 534. Also shown in the illustrated example is an example clock 536 that, for example, is used as a reference for operations of timer logic 537. For example, the clock 536 may be a high-frequency clock (e.g., 500 megahertz (MHz)-1 gigahertz (GHz)) or a clock of any other suitable speed. In some examples, the clock 536 is provided in the system 500. In other examples, the clock 536 is separate from the system 500 and provides a clock signal to the system 500 for operation of timer logic 537. In some examples, the clock 536 is implemented using a clock of the memory controller 130 that is used in the memory controller 130 for other purposes such as controlling the timing of read and/or write operations.

In an example embodiment, the parameter value store 518 includes a data structure (e.g., a look-up table, a mapping table, an association table, etc.) to store reference voltage indicator values each in association with a respective operational condition of MBC memory 550. Some or all of the numerous reference voltage indicator values of parameter value store 518 each correspond (for example) to a respective parameter value—such as a value of a voltage differential or a sensing time differential—for controlling a voltage across capacitor ($C_S$) 564.

In one such embodiment, during operation of system 500, criterion condition detector 524 determines—e.g., based on communication microcontroller 532 and/or other such memory controller logic—that a particular memory cell (in the example embodiment, memory cell 552) is to be a target of a program verification. In response, criterion condition detector 524 identifies to parameter value retrieval 520 both a particular reference voltage which is to be a basis for said program verification, and a characteristic of system 500 that exist (or that is to exist) during said program verification.

Responsive to criterion condition detector 524, parameter value retrieval 520 selects, from among the reference voltage indicator values at parameter value store 518, a value corresponding to the particular reference voltage identified by criterion condition detector 524. The value is selected further based on the characteristic of system 500 which is identified by criterion condition detector 524—e.g., wherein the value is selected over a different indicator value that is associated with the same reference voltage, but also with an alternative characteristic of system 500.

Based on the reference voltage indicator value which is retrieved from parameter value store 518, parameter value retrieval 520 operates other circuitry of system 500 (e.g., one of voltage controller 522 or timer logic 537) to provide a signal which includes an indication of the corresponding reference voltage. By way of illustration and not limitation, parameter value retrieval 520 operates voltage controller 522 to provide at node ($V_{CB}$) 566 a boost voltage which is indicative of a reference voltage that is to be a basis of evaluating threshold voltage ($V_{TH}$) 555. Alternatively or in addition, parameter value retrieval 520 operates timer logic 537 (for example) to close switch 582 (via control signal 583) for a period of time which is indicative of a reference voltage that is to be a basis of evaluating threshold voltage ($V_{TH}$) 555.

In an embodiment, the example voltage controller 522 further controls one or more other voltage levels applied, for example, to the MBC memory 550 and/or the sense amplifier. For example, the voltage controller 522 controls activating the word line WL(y) 558 with, for example, the word line read-verify voltage ($V_{WLRV}$), and controls the precharging of the bit lines BL(x) 560 with, for example, the bit line voltage $V_{bl}$ 562.

The example criterion condition detector 524 is provided for example implementations in which a reference voltage indicator value is from the parameter value store 518 based on criteria corresponding to different operational conditions of the MBC memory 550. In an example embodiment, criteria include one or more of a temperature of a memory cell array of the MBC memory 550, a pressure condition at said memory cell array, a relative arrangement of memory cells, including memory cell 552, within a memory cell array of the MBC memory 550, or a condition of wear of MBC memory 550.

Switch 582, which is coupled to operate in response to a control signal 583, is one example of switch circuitry that selectively enables charging or discharging of capacitor ($C_S$) 564 based on cell current $I_{CELL}$ 556. Switch 580, which is coupled to operate in response to a control signal 581, is an example of switch circuitry that selectively enables a node $V_TC$ 568 at a terminal of capacitor ($C_S$) 564 to be brought to some baseline voltage level (e.g., that of a supply voltage Vcc) in preparation for a program verification which at least partially charges or discharges capacitor ($C_S$) 564. Transistor 570 is coupled (for example) to receive a signal 571 from the illustrative timer logic 537 shown. Responsive to signal 571, transistor 570 is activated or deactivated to selectively enable or disable (respectively) activation of transistor 572—if any—that is based on a voltage at node $V_{TC}$ 568.

In one such embodiment, a latch circuit of MBC memory 550 (e.g., including the illustrative latch circuitry 590 shown) is electrically coupled to conduct a current with transistor 572. Based on said current, latch circuitry 590 provides to programmed state detector 526 an output binary value which indicates whether a currently programmed threshold voltage ($V_{TH}$) 555 of the memory cell 552 is greater than the reference voltage which was determined with parameter value retrieval 520.

The example programmed state detector 526 determines the programmed threshold voltage ($V_{TH}$) 555 of the memory cell 552 based on the binary value(s) provided by latch circuitry 590. By way of illustration and not limitation, the programmed state detector 526 includes circuit logic and/or executing software to determine that a binary one '1' of an output from latch circuitry 590 indicates that the currently programmed threshold voltage ($V_{TH}$) 555 of the memory cell 552 is (for example) less than a particular reference voltage which is indicated by one of parameter value retrieval 520 or criterion condition detector 524.

The example output analyzer 528 is provided to analyze the programmed states determined by the programmed state detector 526. For example, when examples disclosed herein are used during program-verify processes, the output analyzer 528 can analyze the programmed states from the programmed state detector 526 to determine whether memory cells including memory cell 552 are programmed each to a respective target threshold voltage ($V_{THT}$). In some examples, the output analyzer 528 determines soft bit information from memory cells. For example, the output analyzer 528 may analyze programmed states from the programmed state detector 526 to analyze the threshold voltage ($V_{TH}$) distributions of the memory cells to determine whether to shift threshold voltage ($V_{TH}$) range boundaries (e.g., reference voltages) to represent stored data. For example, over time the MBC memory 550 may degrade or otherwise undergo changes to its electrical properties. Under such circumstances, ranges of threshold voltages ($V_{TH}$) that represent stored information may shift such that a threshold voltage ($V_{TH}$) distribution of the MBC memory 550 loses its accuracy in representing the stored information. To avoid losing such stored information, reference voltages defining the range boundaries of the threshold voltages ($V_{TH}$) may be changed to align the threshold voltage ($V_{TH}$) distribution of the MBC memory 550 to accurately correspond to the stored information.

The example I/O buffer interface 530 is provided to output data stored in the MBC memory 550 to a memory data bus (not shown). For example, when a host processor requests data to be read from the MBC memory 550, the system 500 may read data from the MBC memory 550 using examples disclosed herein and the I/O buffer interface 530 may load the read data to a memory data bus that is accessible by the host processor.

The example microcontroller 532 is provided to execute machine readable instructions to implement one or more components of the example system 500. The example instruction memory 534 is provided to store machine readable instructions executable by the microcontroller 532 to implement one or more components of the system 500. In some examples, the microcontroller 532 and the instruction memory 534 are omitted, and the components of the system 500 are implemented in logic circuits and/or other suitable hardware. In some examples, some components of the system 500 are implemented using machine readable instructions stored in the instruction memory 534 and executed by the microcontroller 532 and others of the components of the system 500 are implemented in hardware.

While an example manner of implementing the example system 500 is illustrated in FIG. 5, one or more of the elements, processes and/or devices illustrated in FIG. 5 may be combined, divided, re-arranged, omitted, eliminated and/or implemented in any other way. Further, the example timer logic 537, the example parameter value store 518, the example parameter value retriever 520, the example voltage controller 522, the example criterion condition detector 524, the example programmed state detector 526, the example output analyzer 528, the example I/O buffer interface 530, and/or, more generally, the example system 500 of FIG. 5 may be implemented by hardware, software, firmware and/or any combination of hardware, software and/or firmware. Thus, for example, any of the example timer logic 537, the example parameter value store 518, the example parameter value retriever 520, the example voltage controller 522, the example criterion condition detector 524, the example programmed state detector 526, the example output analyzer 528, the example I/O buffer interface 530, and/or, more generally, the example system 500 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example timer logic 537, the example parameter value store 518, the example parameter value retriever 520, the example voltage controller 522, the example criterion condition detector 524, the example programmed state detector 526, the example output analyzer 528, and/or the example I/O buffer interface 530 is/are hereby expressly defined to include a tangible computer readable storage device or storage disk such as a memory, a digital versatile disk (DVD), a compact disk (CD), a Blu-ray disk, etc. storing the software and/or firmware. Further still, the example system 500 of FIG. 5 may include one or more elements, processes and/or devices in addition to, or instead of, those illustrated in FIG. 5, and/or may include more than one of any or all of the illustrated elements, processes and devices.

Figure 6:
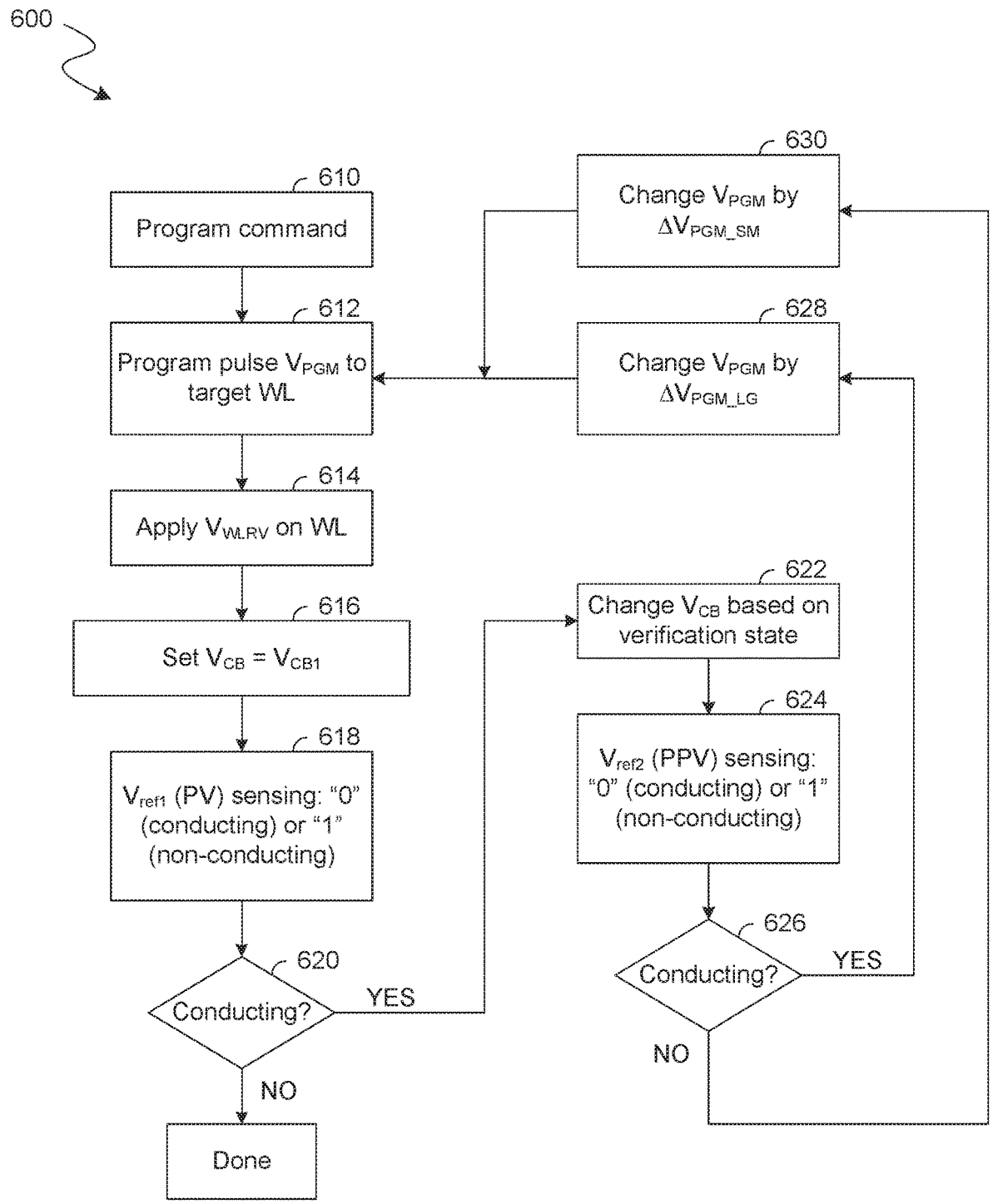
FIGS. 6 and 7 illustrate flow diagrams each showing features of a respective method to verify programming of a memory cell according to a corresponding embodiment.
Figure 7:
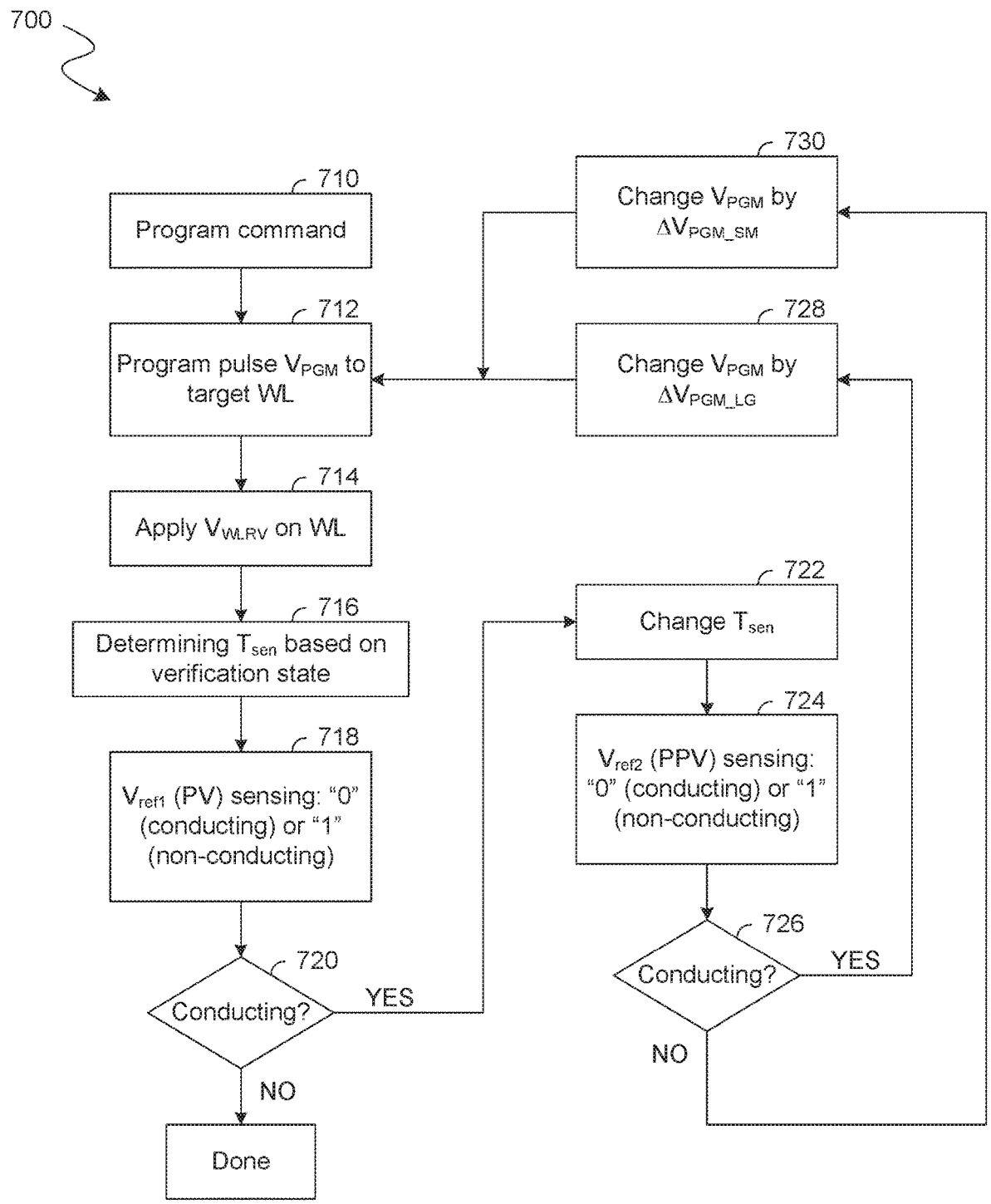

FIGS. 6 and 7 show features of respective methods 600, 700 each to verify, according to a corresponding embodiment, whether a MBC of a memory has been correctly programmed with intended data. In various embodiments, method 600 or method 700 is performed to verify programming of one of MBC memory 104, MBC memory 304, or MBC memory 550—e.g., wherein the one of methods 600, 700 includes features of method 200.

Figure 8:
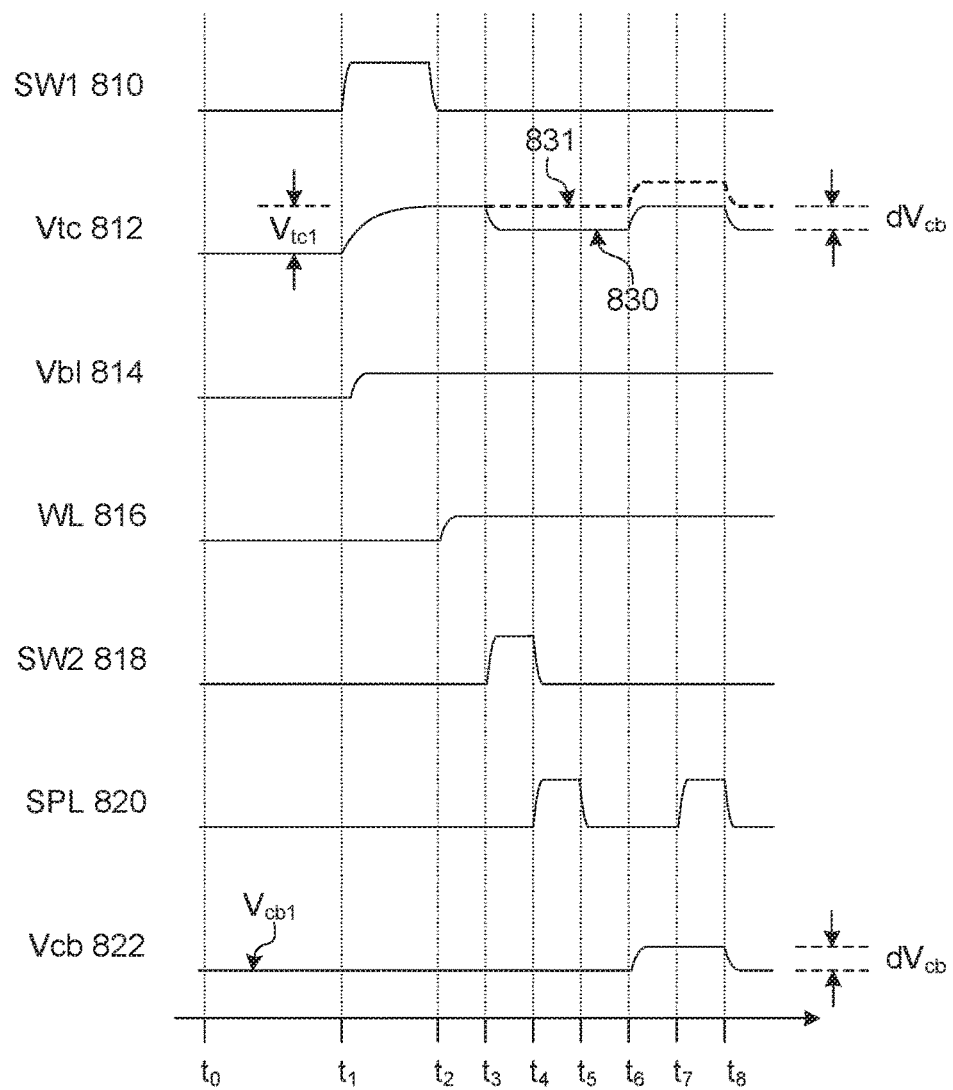
FIG. 8 illustrates a timing diagram showing signals communicated to verify programming of a memory cell according to an embodiment.

To illustrate certain features of various embodiments, methods 600, 700 are variously described herein with reference to a timing diagram 800 shown in FIG. 8. Timing diagram 800 illustrates one example of signals which are variously communicated, for example, during operations of circuitry such as that of system 500.

In FIG. 8, timing diagram 800 shows the communication of various signals (e.g., including a transistor voltage, a switch control signal, or the like) over a duration of time 805. For example, timing diagram 800 shows a switch control signal SW1 810 and a voltage Vtc 812 at a capacitor of a sense amplifier, where control signal SW1 810 is to operate first switch circuitry that selectively enables voltage Vtc 812 to be brought to some baseline voltage level in preparation for a program verification.

Timing diagram 800 further shows voltages Vbl 814, WL 816 which are variously provided, via a bit line and a word line (respectively), to a memory cell which is targeted by the program verification. Timing diagram 800 further shows another switch control signal SW2 818 to operate second switch circuitry that selectively enables a charging or discharging of the sense amplifier's capacitor—e.g., where such charging or discharging is based on an activation (if any) of the targeted memory cell. Timing diagram 800 further shows a sample control signal SPL 820 which is provided to selectively enable or disable a sampling of the voltage Vtc 812. Timing diagram 800 further shows a boost voltage Vcb 822 that is provided, at another terminal of the sense amplifiers' capacitor, to facilitate program verification based on a particular reference voltage.

With reference to the example embodiment of system 500, for example, switch control signals SW1 810, SW2 818 and sample control signal SPL 820 correspond functionally to control signals 581, 583 and signal 571 (respectively). In one such embodiment, voltages Vtc 812, Vbl 814, and WL 816 correspond functionally to voltage $V_{TC}$ 568, bit line voltage $(V_{bl})$ 562, word line WL(y) 558 (respectively)—e.g., where boost voltage Vcb 822 is a voltage at node 566.

Referring now to FIG. 6, method 600 includes (at 610) detecting a command to program a MBC of a memory with a target threshold voltage level $V_{TGT}$ which corresponds to an intended multi-bit data value. In response to the program command which is detected at 610, method 600 services the command, at least in part, by providing a program pulse $V_{PGM}$ (at 612) to a word line which includes the memory cell targeted by the program command. The program pulse $V_{PGM}$ results in a change, toward the target threshold voltage level $V_{TGT}$, to a threshold voltage Vm of the targeted memory cell. In the example embodiment illustrated by timing diagram 800, the program pulse $V_{PGM}$ is provided as voltage WL 816 prior to the time to shown in FIG. 8.

After the program pulse $V_{PGM}$ is provided at 612, a program verification is performed to detect, at least, whether a resulting programmed threshold voltage Vm of the targeted memory cell is above (e.g., at or above) a first reference voltage level $V_{ref1}$. Referring again to the example embodiment shown by timing diagram 800, preparation for such program verification includes an assertion of SW1 810, between time $t_1$ and time t2, to initiate a ramping of voltage Vtc 812. For example, SW1 810 selectively activates switch circuitry to provide a conductive path between a capacitor and a supply voltage—e.g., where switch 580 provides a conductive path to capacitor ($C_S$) 564. In an embodiment, Vtc 812 begins to increase by an amount $V_{tc1}$ around the time $t_1$ when SW1 810 is asserted.

Referring again to FIG. 6, the program verification includes (at 614) applying a word line read-verify voltage $(V_{WLRV})$ on a word line which includes the targeted memory cell. The program verification further comprises (at 616) setting a capacitor boost voltage $V_{CB}$ to a voltage level $V_{CB1}$. In some embodiments, the voltage level $V_{CB1}$ is a ground voltage or other such reference potential. In other embodiments, the voltage level $V_{CB1}$ is indicative of a particular reference voltage which is to be a basis for evaluating a currently programmed threshold voltage $V_{TH}$ of the targeted memory cell—e.g., where the particular voltage level $V_{CB1}$ is provided based on a combination of the reference voltage and one or more of a temperature of the device which includes the targeted memory cell, a pressure condition at said device, a relative arrangement of memory cells within a memory cell array of the device, or a wear condition of the device. In the example embodiment illustrated by timing diagram 800, applying the word line read-verify voltage $(V_{WLRV})$ at 614 includes increasing WL 816 at around the time t2 shown—e.g., where setting the capacitor boost voltage $V_{CB}$ at 616 includes providing a voltage level $V_{CB1}$ at Vcb 822.

Referring again to FIG. 6, method 600 comprises (at 618) performing a first sensing based on the first reference voltage level $V_{ref1}$ (e.g., a PV voltage level). In the example embodiment illustrated by timing diagram 800, such first sensing includes SW2 818 being asserted, between the times $t_3$, $t_4$ shown, to enable an at least partial discharging (or alternatively, charging) of a capacitor such as $C_S$ 564. Such discharging, if any, is based on an activation of the targeted memory cell with bit line voltage Vbl 814 (which is increased at around time $t_1$ to enable said activation), and with word line voltage WL 816. For example, voltage Vtc 812 exhibits a small decrease 830, which begins at time $t_3$, in response to the assertion of SW2 818 while a transistor of the memory cell (due to a currently programmed threshold voltage $V_{TH}$) is being activated with WL 816 and Vbl 814. Timing diagram 800 also shows a dashed line 831 at voltage Vtc 812 to represent an alternative scenario wherein voltage Vtc 812 omits any such small decrease 830 at time $t_3$—e.g., wherein the memory cell transistor (due to its currently programmed threshold voltage $V_{TH}$) is not activated with WL 816 and Vbl 814. After deassertion of SW2 818, the voltage Vtc 812 is sampled using a first assertion of control signal SPL 820 between time $t_4$ and time $t_5$. Such assertion enables the sense amplifier to generate a signal including a binary value (indicative of the sampled voltage Vtc 812) which represents a determination as to whether a currently programmed threshold voltage ($V_{TH}$) of the targeted memory cell is greater than the first reference voltage level $V_{ref1}$. In the example embodiment of method 600, a binary value of "0" corresponds to the threshold voltage ($V_{TH}$) being less than $V_{ref1}$, and a binary value of "1" corresponds to the threshold voltage ($V_{TH}$) being greater than $V_{ref1}$.

Referring again to FIG. 6, method 600 further comprises determining (at 620), based on the first sensing at 618, whether the currently programmed threshold voltage ($V_{TH}$) of the memory cell is greater than the first reference voltage level $V_{ref1}$. In the example shown, a conducting output signal corresponds to a false (Boolean "0") result of the sensing at 618. Where threshold voltage $V_{TH}$ is determined at 620 to be greater than reference voltage level $V_{ref1}$, method 600 is done at least with respect to servicing the program command in question. Where it is instead determined at 620 that threshold voltage Vm is less than reference voltage level $V_{ref1}$, method 600 changes capacitor boost voltage VC (at 622) based on a verification state of the memory device. In an embodiment, the verification state includes one or more of a temperature of the memory device, a pressure condition at the memory device, a relative arrangement of memory cells within the memory device, or a wear condition of the memory device. In the example embodiment illustrated by timing diagram 800, the changing at 622 includes increasing Vcb 822, at time $t_6$, by an amount $dV_{cb}$—e.g., where said increasing of Vcb 822 contributes to a corresponding increase in voltage Vtc 812.

Referring again to FIG. 6, method 600 comprises (at 624) performing a second sensing based on a second reference voltage level $V_{ref2}$ (e.g., a PPV voltage level). For example, in one such embodiment, the capacitor boost voltage $V_{CB}$ is changed at 622 to a level which is indicative of reference voltage level $V_{ref2}$. In the example embodiment illustrated by timing diagram 800, such second sensing at 624 includes sampling voltage Vtc 812 using a second assertion of control signal SPL 820 between the times $t_7$, $t_8$ shown. Such second assertion of control signal SPL 820 enables the sense amplifier to generate a signal including another binary value which represents a later determination as to whether the currently programmed threshold voltage ($V_{TH}$) of the targeted memory cell is greater than the second reference voltage level $V_{ref2}$.

Referring again to FIG. 6, method 600 further comprises (at 626) determining, based on the second sensing at 624, whether the currently programmed threshold voltage ($V_{TH}$) of the memory cell is greater than the reference voltage level $V_{ref2}$. Where threshold voltage $V_{TH}$ is determined at 626 to be less than reference voltage level $V_{ref2}$ (as indicated, for example, by a binary value of "0" being generated by the second sensing at 624), method 600 changes—e.g., increases—a magnitude of the program pulse $V_{PGM}$ by an amount $\Delta V_{PGM\_LG}$ (at 628) in preparation for a next application of program pulse $V_{PGM}$ at 612. By contrast, where it is instead determined at 626 that threshold voltage $V_{TH}$ is greater than reference voltage level $V_{ref2}$, method 600 changes the magnitude of the program pulse $V_{PGM}$ (at 630) by a relatively small amount $\Delta V_{PGM\_SM}$ (as compared to $\Delta V_{PGM\_LG}$) in preparation for the next application of program pulse $V_{PGM}$ at 612.

Referring now to FIG. 7, method 700 is an example of another embodiment wherein a different parameter—in this case, a period of time for sensing activation (if any) of a programmed memory cell—is determined based on a signal which indicates a reference voltage. In one such embodiment, the indication of the reference voltage is selected, calculated or otherwise determined to be communicated with the signal based on a verification state which includes one or more of a temperature of a memory device, a pressure condition at the memory device, a relative arrangement of memory cells within the memory device, or a wear condition of the memory device.

As shown in FIG. 7, method 700 includes detecting a command to program a memory cell of a memory (at 710), and servicing the program command by providing a program pulse $V_{PGM}$ (at 712), and applying a word line read-verify voltage $V_{WLRV}$ (at 714) on a word line which includes the targeted memory cell. For example, operations 710, 712, 714 include some or all features of the operations 610, 612, 614 of method 600.

In various embodiments, program verification by method 700 comprises (at 716) determining a configurable sensing time $T_{SEN}$ based on a verification state of the memory device. The verification state includes one or more of a temperature of the memory device, a pressure condition at the memory device, a relative arrangement of memory cells within the memory device, or a wear condition of the memory device. In some embodiments, determination of the sensing time $T_{SEN}$ at 716 is further based on a first reference voltage level $V_{ref1}$ (e.g., a PV voltage level). In one such embodiment, a switch control signal to subsequently provide the determined sensing time $T_{SEN}$ includes an indication of the first reference voltage level $V_{ref1}$, said indication corresponding to the verification state.

The sensing time $T_{SEN}$ is a period of time for sensing activation (if any) of the targeted memory cell. In one example embodiment, such as one illustrated by system 500, the sensing time $T_{SEN}$ is a period of time during which switch 582 is closed (e.g., activated) to provide a conductive path that enables charging or discharging of capacitor ($C_S$) 564 based on $I_{CELL}$ 556. In an example embodiment such as that illustrated by timing diagram 800, determining the sensing time $T_{SEN}$ at 716 includes selecting, calculating or otherwise identifying—and subsequently, providing—a configurable length of the period of time ($t_4$–$t_3$) during which switch control signal SW2 818 is activated.

Method 700 further comprises (at 718) performing a first sensing based on the first reference voltage level $V_{ref1}$. The first sensing at 718 results in a sense amplifier generating a signal comprising a binary value similar to that which is described herein with reference to the sensing at 618. In the example embodiment of method 700, generation of a binary value "0" corresponds to a currently programmed threshold voltage ($V_{TH}$) being greater than $V_{ref1}$, and a binary value of "1" corresponds to the threshold voltage ($V_{TH}$) being less than $V_{ref1}$.

Method 700 further comprises determining (at 720), based on the first sensing at 718, whether the currently programmed threshold voltage ($V_{TH}$) of the memory cell is greater than the first reference voltage level $V_{ref1}$. In the example shown, a conducting output signal corresponds to a false (Boolean "0") result of the sensing at 718. Where threshold voltage Vm is determined at 720 to be greater than reference voltage level $V_{ref1}$, method 700 is done, at least with respect to servicing the program command in question. Where it is instead determined at 720 that threshold voltage Vm is less than reference voltage level $V_{ref1}$, method 700 changes the duration of the sensing time $T_{SEN}$ (at 722)—e.g., by applying a predetermined change to the duration of $T_{SEN}$ which is determined at 716. In one embodiment, an amount of the predetermined change does not depend on the verification state which was a basis for determining $T_{SEN}$ at 716.

Method 700 further comprises (at 724) performing a second sensing based on a second reference voltage level $V_{ref2}$ (e.g., a PPV voltage level). For example, in one such embodiment, switch circuitry—e.g., including one or both of switches 580, 582—is again operated to bring a voltage across capacitor ($C_S$) 564 to a baseline level. The switch circuitry is then operated to enable, for the changed period of time $T_{SEN}$, a change, if any, to the voltage across capacitor ($C_S$) 564 (said change due to any memory cell activation with word line read-verify voltage ($V_{WLRV}$) and bit line voltage $V_{bl}$ 562). Due at least in part to the changed duration of $T_{SEN}$, the resulting voltage across capacitor ($C_S$) 564—which is sampled at 724 with switches 570, 572, and signal 571—is indicative of whether the currently programmed threshold voltage ($V_{TH}$) of the memory cell is greater than the reference voltage level $V_{ref2}$. In an alternate embodiment, the duration of $T_{SEN}$ determined at 716 independent of the verification state, where (instead) the duration of the sensing time $T_{SEN}$ is changed at 722 by applying a predetermined change which is based on the verification state.

Method 700 further comprises (at 726) determining, based on the second sensing at 724, whether the currently programmed threshold voltage ($V_{TH}$) of the memory cell is greater than the reference voltage level $V_{ref2}$. Where threshold voltage $V_{TH}$ is determined at 726 to be less than reference voltage level $V_{ref2}$ (as indicated, for example, by a binary value of "0" being generated by the second sensing at 724), method 700 changes—e.g., increases—a magnitude of the program pulse $V_{PGM}$ (at 728) by an amount $\Delta V_{PGM\_LG}$ in preparation for a next application of program pulse $V_{PGM}$ at 712. By contrast, where it is instead determined at 726 that threshold voltage $V_{TH}$ is greater than reference voltage level $V_{ref2}$, method 700 changes the magnitude of the program pulse $V_{PGM}$ (at 730) by a relatively small amount $\Delta V_{PGM\_SM}$ in preparation for the next application of program pulse $V_{PGM}$ at 712.

Figure 9:
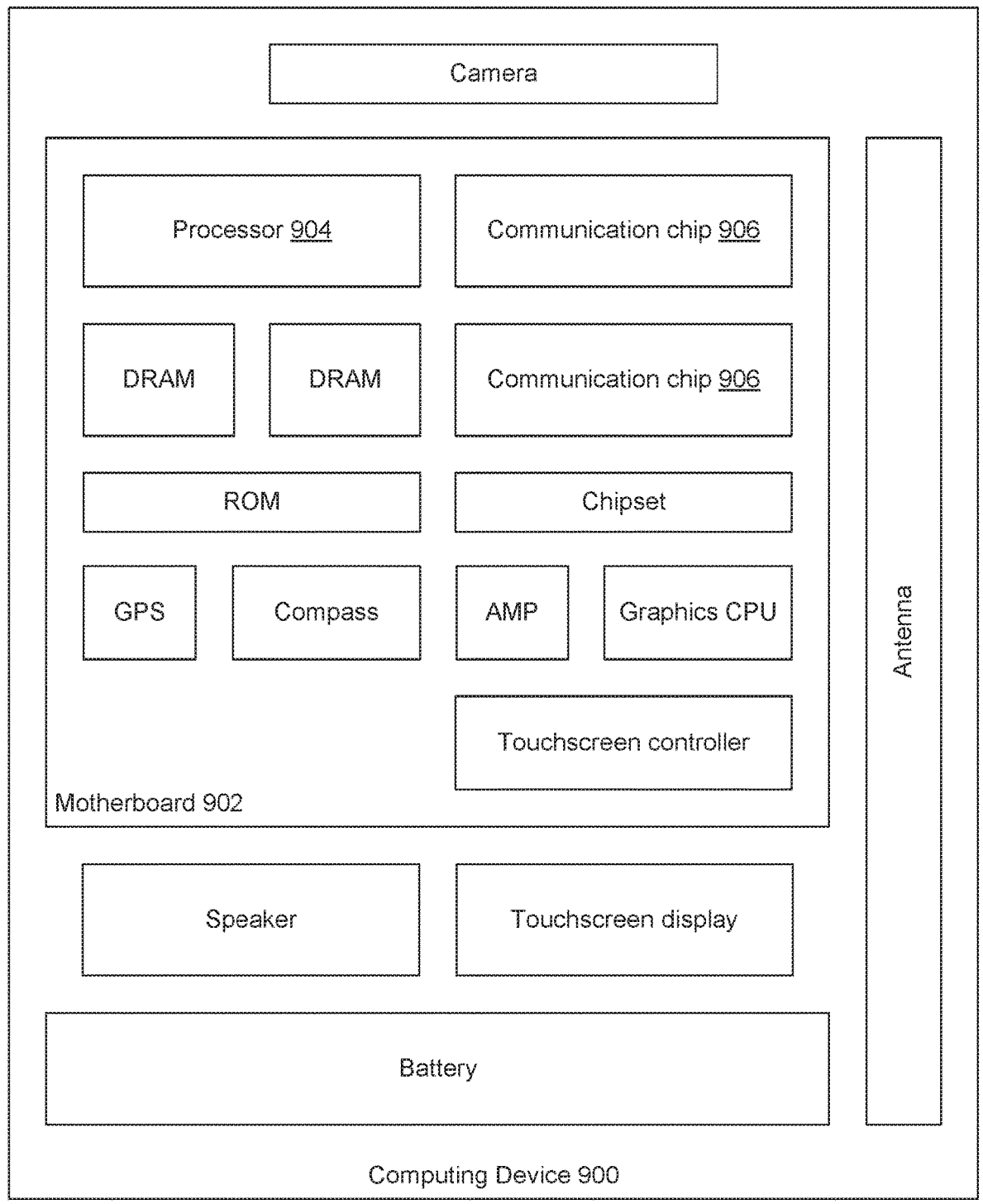
FIG. 9 illustrates a functional block diagram illustrating a computing device in accordance with one embodiment.

FIG. 9 illustrates a computing device 900 in accordance with one embodiment. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. The term "processor" may refer to any device or portion of a device that processes electronic data from registers and/or memory to transform that electronic data into other electronic data that may be stored in registers and/or memory. The communication chip 906 also includes an integrated circuit die packaged within the communication chip 906.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 10:
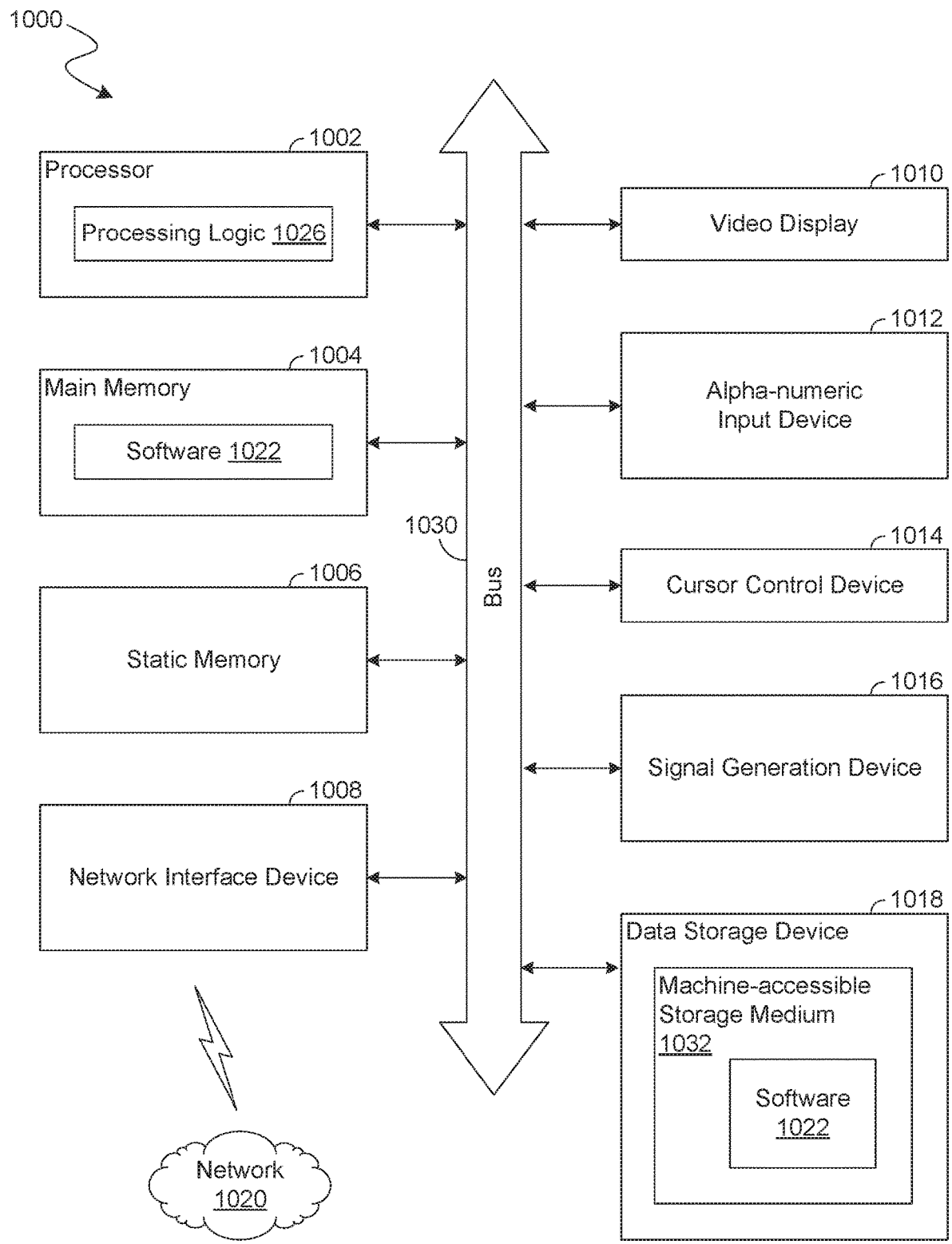
FIG. 10 illustrates a functional block diagram illustrating an exemplary computer system, in accordance with one embodiment.

FIG. 10 illustrates a diagrammatic representation of a machine in the exemplary form of a computer system 1000 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1000 includes a processor 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a secondary memory 1018 (e.g., a data storage device), which communicate with each other via a bus 1030.

Processor 1002 represents one or more general-purpose processing devices such as a microprocessor, central processing unit, or the like. More particularly, the processor 1002 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1002 may also be one or more special-purpose processing devices such as an application specific integrated circuit (ASIC), a field programmable gate array (FPGA), a digital signal processor (DSP), network processor, or the like. Processor 1002 is configured to execute the processing logic 1026 for performing the operations described herein.

The computer system 1000 may further include a network interface device 1008. The computer system 1000 also may include a video display unit 1010 (e.g., a liquid crystal display (LCD), a light emitting diode display (LED), or a cathode ray tube (CRT)), an alphanumeric input device 1012 (e.g., a keyboard), a cursor control device 1014 (e.g., a mouse), and a signal generation device 1016 (e.g., a speaker).

The secondary memory 1018 may include a machine-accessible storage medium (or more specifically a computer-readable storage medium) 1032 on which is stored one or more sets of instructions (e.g., software 1022) embodying any one or more of the methodologies or functions described herein. The software 1022 may also reside, completely or at least partially, within the main memory 1004 and/or within the processor 1002 during execution thereof by the computer system 1000, the main memory 1004 and the processor 1002 also constituting machine-readable storage media. The software 1022 may further be transmitted or received over a network 1020 via the network interface device 1008.

While the machine-accessible storage medium 1032 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Techniques and architectures for operating a memory device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A non-volatile memory device comprising:
    first circuitry to perform a detection that a first write, to a first cell of a memory array, is to be verified;
    second circuitry coupled to the first circuitry, the second circuitry to:
        perform, based on the detection, an identification of a first indication of a first reference voltage level as corresponding to a first state, wherein the first indication is one of various indications of the first reference voltage level, wherein the second circuitry is able to identify each of the various indications as corresponding to a different respective one of multiple states comprising the state, wherein, for each state of the multiple states, the state comprises one of a respective thermal condition at the memory array, a respective pressure condition at the memory array, a respective wear condition of the memory array, or a position of a respective cell of the memory array relative to one or more other cells of the memory array; and
        generate a first signal, based on the identification, which comprises the first indication of the first reference voltage level;
    wherein the second circuitry is to be coupled to sense amplifier circuitry which is to:
        receive a first input based on the first signal and further based on a voltage to be provided at a first word line which comprises the first cell; and
        provide a first output, based on the first input, which indicates whether a first threshold voltage of the cell is greater than the first reference voltage level.

2. The non-volatile memory device of claim 1, wherein, for each of the various indications of the first reference voltage level, the second circuitry is to determine:
    a different respective boost voltage to be provided at a capacitor of the sense amplifier circuitry; or
    a different respective period of time during which a control signal is to be asserted to operate a switch of the sense amplifier circuitry.

3. The non-volatile memory device of claim 1, wherein:
the first input is to comprise a boost voltage to be provided at a capacitor of the sense amplifier circuitry; or
the first input is to comprise a control signal to operate a switch of the sense amplifier circuitry, wherein the first indication of the first reference voltage level is to comprise a period of time during which the control signal is to be asserted.

4. The non-volatile memory device of claim 1, wherein the second circuitry is to perform the identification of the first indication based on a number which corresponds to each word line of a group of word lines.

5. The non-volatile memory device of claim 1, wherein the multiple states further comprise a second state, wherein the various indications of the first reference voltage level further comprise a second indication of the first reference voltage level, wherein the second circuitry is further to:
perform, based on another detection that a second write is to be verified, another identification of the second indication as corresponding to the second state; and
generate a second signal which comprises the second indication;
wherein the sense amplifier circuitry is further to:
receive a second input based on the second signal and further based on another voltage to be provided at a targeted word line which comprises the targeted cell; and
provide a second output, based on the second input, which indicates whether a second threshold voltage is greater than the first reference voltage level.

6. The non-volatile memory device of claim 5, wherein the first input is to comprise a first change to a boost voltage to be provided at a capacitor of the sense amplifier circuitry;
wherein the second input is to comprise a second change to the boost voltage;
wherein the first change and the second change are based on a first temperature and a second temperature, respectively;
wherein the second temperature is greater than the first temperature; and
wherein the first change is smaller than the second change.

7. The non-volatile memory device of claim 5, wherein the first input is to comprise a first change to a boost voltage to be provided at a capacitor of the sense amplifier circuitry;
wherein the second input is to comprise a second change to the boost voltage;
wherein the first change and the second change are based on a first pressure and a second pressure, respectively;
wherein the second pressure is greater than the first pressure; and
wherein the first change is larger than the second change.

8. The non-volatile memory device of claim 5, wherein the targeted cell is a second cell other than the first cell;
wherein the first state comprises a first position of the first cell relative to the one or more other cells of the memory array;
wherein the second state comprises a second position of the second cell relative to the one or more other cells of the memory array;
wherein the first word line is electrically coupled between the targeted word line and the sense amplifier circuitry;
wherein the first input is to comprise a first change to a boost voltage provided at a capacitor of the sense amplifier circuitry;
wherein the second input is to comprise a second change to the boost voltage;
wherein the first change and the second change are based on the first position and the second position, respectively; and
wherein the first change is larger than the second change.

9. The non-volatile memory device of claim 1, wherein the first signal is further based on a determination that the first threshold voltage is less than a second reference voltage level, wherein the determination is based on a second output from the sense amplifier circuitry.

10. The non-volatile memory device of claim 1, wherein the second circuitry to perform the identification of the first indication as corresponding to the first state which comprises the second circuitry to determine that the first indication corresponds to a combination of at least two of a first thermal condition, a first pressure condition, a first wear condition, or a first relative position of the first cell.

11. A system comprising:
a memory comprising a non-volatile memory array and sense amplifier circuitry;
a memory controller comprising circuitry to:
perform a detection that a first write, to a first cell of the memory array, is to be verified;
perform, based on the detection, an identification of a first indication of a first reference voltage level as corresponding to a first state, wherein the first indication is one of various indications of the first reference voltage level, wherein the memory controller is able to identify each of the various indications as corresponding to a different respective one of multiple states comprising the first state, wherein, for each state of the multiple states, the state comprises one of a respective thermal condition at the memory array, a respective pressure condition at the memory array, a respective wear condition of the memory array, or a position of a respective cell of the memory array relative to one or more other cells of the memory array; and
generate a first signal, based on the identification, which comprises the first indication of the first reference voltage level;
wherein the sense amplifier circuitry is to:
receive a first input based on the first signal and further based on a voltage to be provided at a first word line which comprises the first cell; and
provide a first output, based on the first input, which indicates whether a first threshold voltage of the cell is greater than the first reference voltage level; and
a display device coupled to the memory controller, the display device to display an image based on the first output.

12. The system of claim 11, wherein, for each of the various indications of the first reference voltage level, the memory controller is to determine:
a different respective boost voltage to be provided at a capacitor of the sense amplifier circuitry; or
a different respective period of time during which a control signal is to be asserted to operate a switch of the sense amplifier circuitry.

13. The system of claim 11, wherein:
the first input is to comprise a boost voltage to be provided at a capacitor of the sense amplifier circuitry; or
the first input is to comprise a control signal to operate a switch of the sense amplifier circuitry, wherein the first indication of the first reference voltage level is to comprise a period of time during which the control signal is to be asserted.

14. The system of claim 11, wherein the memory controller is to perform the identification of the first indication based on a number which corresponds to each word line of a group of word lines.

15. The system of claim 11, wherein the multiple states further comprise a second state, wherein the various indications of the first reference voltage level further comprise a second indication of the first reference voltage level, wherein the memory controller is further to:
perform, based on another detection that a second write is to be verified, another identification of the second indication as corresponding to the second state; and
generate a second signal which comprises the second indication;
wherein the sense amplifier circuitry is further to:
receive a second input based on the second signal and further based on another voltage provided at a targeted word line which comprises the targeted cell; and
provide a second output, based on the second input, which indicates whether a second threshold voltage is greater than the first reference voltage level.

16. A method comprising:
detecting that a first write, to a first cell of a non-volatile memory array, is to be verified;
based on the detecting, identifying a first indication of a first reference voltage level as corresponding to a first state, wherein the first indication is one of various indications of the first reference voltage level, wherein the various indications each correspond to a different respective one of multiple states comprising the first state, wherein, for each state of the multiple states, the state comprises one of a respective thermal condition at the memory array, a respective pressure condition at the memory array, a respective wear condition of the memory array, or a position of a respective cell of the memory array relative to one or more other cells of the memory array; and
based on the identifying, generating a first signal which comprises the first indication of the first reference voltage level;
wherein sense amplifier circuitry coupled to the memory array:
receives a first input based on the first signal and further based on a voltage to be provided at a first word line which comprises the first cell; and
provides a first output, based on the first input, which indicates whether a first threshold voltage of the cell is greater than the first reference voltage level.

17. The method of claim 16, further comprising:
for each of the various indications of the first reference voltage level, determining:
a different respective boost voltage provided at a capacitor of the sense amplifier circuitry; or
a different respective period of time during which a control signal is to be asserted to operate a switch of the sense amplifier circuitry.

18. The method of claim 16, wherein:
the first input comprises a boost voltage to be provided at a capacitor of the sense amplifier circuitry; or
the first input comprises a control signal to operate a switch of the sense amplifier circuitry, wherein the indication of the first reference voltage level includes a period of time during which the control signal is asserted.

19. The method of claim 16, wherein the first signal is further based on a determination that the first threshold voltage is less than a second reference voltage level, wherein the determination is based on a second output from the sense amplifier circuitry.

20. The method of claim 16, wherein identifying the first indication as corresponding to the first state which comprises determining that the first indication corresponds to a combination of at least two of a first thermal condition, a first pressure condition, a first wear condition, or a first relative position of the first cell.

* * * * *